(12) United States Patent
Brunner

(10) Patent No.: US 11,450,598 B2
(45) Date of Patent: Sep. 20, 2022

(54) PACKAGE INCLUDING A SUBSTRATE WITH HIGH RESOLUTION RECTANGULAR CROSS-SECTION INTERCONNECTS

(71) Applicant: QUALCOMM Incorporated, San Diego, CA (US)

(72) Inventor: Sebastian Brunner, Deutschlandsberg (AT)

(73) Assignee: Qualcomm Incorporated, San Diego, CA (US)

( * ) Notice: Subject to any disclaimer, the term of this patent is extended or adjusted under 35 U.S.C. 154(b) by 56 days.

(21) Appl. No.: 16/941,472

(22) Filed: Jul. 28, 2020

(65) Prior Publication Data

US 2022/0037246 A1 Feb. 3, 2022

(51) Int. Cl.
| | |
|---|---|
| H01L 23/498 | (2006.01) |
| H01L 21/48 | (2006.01) |
| H01L 21/56 | (2006.01) |
| H01L 23/15 | (2006.01) |
| H01L 23/31 | (2006.01) |
| H01L 23/00 | (2006.01) |

(52) U.S. Cl.
CPC .... *H01L 23/49838* (2013.01); *H01L 21/4853* (2013.01); *H01L 21/4857* (2013.01); *H01L 21/4867* (2013.01); *H01L 21/565* (2013.01); *H01L 23/15* (2013.01); *H01L 23/3128* (2013.01); *H01L 23/49822* (2013.01); *H01L 23/49866* (2013.01); *H01L 24/16* (2013.01); *H01L 2224/16227* (2013.01)

(58) Field of Classification Search
CPC ........... H01L 23/49822; H01L 21/4857; H01L 23/49838; H01L 21/565; H01L 21/4853; H01L 23/49866; H01L 23/3128; H01L 24/16; H01L 2224/16227; H01L 2224/73267

See application file for complete search history.

(56) References Cited

U.S. PATENT DOCUMENTS

| | | | |
|---|---|---|---|
| 7,301,228 B2 * | 11/2007 | Usui | H01L 21/6835 174/251 |
| 2007/0037374 A1 | 2/2007 | Hayashi et al. | |
| 2015/0008020 A1 * | 1/2015 | Kaneko | H05K 3/465 174/257 |
| 2019/0096841 A1 | 3/2019 | Liu et al. | |
| 2019/0252305 A1 * | 8/2019 | Peng | H01L 21/4853 |
| 2020/0027833 A1 | 1/2020 | Lee et al. | |

OTHER PUBLICATIONS

International Search Report and Written Opinion—PCT/US2021/038970—ISA/EPO—dated Oct. 13, 2021.

* cited by examiner

Primary Examiner — Jasmine J Clark
(74) Attorney, Agent, or Firm — Loza & Loza, LLP

(57) ABSTRACT

A package that includes an integrated device, a substrate coupled to the integrated device, and an encapsulation layer coupled to the substrate. The encapsulation layer encapsulates the integrated device. The substrate includes at least one dielectric layer, a plurality of interconnects located in the at least one dielectric layer, wherein at least one of the interconnects has a rectangular side cross-section having at least one corner with a corner radius less than a corner radius threshold.

26 Claims, 26 Drawing Sheets

SIDE PROFILE VIEW

SIDE PROFILE VIEW

TOP PLAN VIEW

TOP PLAN VIEW

TOP PLAN VIEW

SIDE PROFILE VIEW

SIDE PROFILE VIEW

TOP PLAN VIEW

TOP PLAN VIEW

TOP PLAN VIEW

SIDE PROFILE VIEW

SIDE PROFILE VIEW

SIDE PROFILE VIEW

PACKAGE INCLUDING A SUBSTRATE WITH HIGH RESOLUTION RECTANGULAR CROSS-SECTION INTERCONNECTS

FIELD

Various features relate to packages that include an integrated device, but more specifically to a package that includes an integrated device and a substrate that includes interconnects that have substantially rectangular cross-sections and to processes for fabricating such packages.

BACKGROUND

FIG. 1 illustrates a package 100 that includes a substrate 102 and a plurality of solder interconnects 120. The substrate 102 includes at least one dielectric layer 104 and a plurality of generally horizontal interconnects 108 (only some of which are specifically identified with reference numerals). Although not shown, the package may additionally include vertical vias interconnecting the various interconnects 108.

The interconnects 108 of FIG. 1 have rough or uneven cross-sections that arise from limitations in practical thick film paste fabrication procedures. That is, although design rules for an initial package may specify precise rectangular cross-sections, the resulting post-fabrication interconnects (when fabricated in ceramic dielectrics) are oblong, lens-shaped or may have other non-rectangular shapes. For example, current screen-print fabrication procedures can result in post-fabrication interconnects of the type shown in FIG. 1. Hence, although the intent of the fabrication process may be to form interconnects that have precise rectangular side cross-sections (or other precise cross-sectional shapes), the actual resulting interconnects often have side cross-sectional shapes that only crudely approximate the intended shape.

Note that technical drawings of package substrates often show interconnects with sharp and precise rectangular cross-sections. This may be done for drafting convenience but such drawings often do not accurately capture the actual fabricated shapes of interconnects and other structures that are formed using a thick film screen-print fabrication process. The actual resulting fabricated shapes are often quite different from the ideal desired shapes of a specified design.

In the case of electrical interconnects within a substrate, the resulting rough, oblong or lens-shaped cross-sections of the interconnects can cause losses in radio frequency (RF) performance due to skin effects as compared to interconnects with rectangular cross-sections. Moreover, practical limitations in screen-print fabrication processes can limit the resolution of the fabricated interconnects, in terms of line/width resolution or accuracy. Furthermore, cutouts (e.g. pinhole like-openings) in planar interconnects fabricated using screen-print processes tend to close due to the surface tension, thus degrading performance.

There is an ongoing need to provide packages and substrates that include interconnects that have shapes that side cross sectional rectangular designs and to provide fabrication processes for forming such packages and substrates.

SUMMARY

Various features relate to packages or substrates but more specifically to a package that includes a substrate with interconnects with rectangular side cross-sections.

One example provides a package that includes an integrated device and a substrate coupled to the integrated device. The substrate includes at least one dielectric layer and a plurality of interconnects located in the at least one dielectric layer, wherein at least one interconnect has a cross-sectional thickness that varies along a length of the interconnect by no more than 3 micrometers.

Another example provides a substrate includes at least one dielectric layer and a plurality of interconnects located in the at least one dielectric layer, wherein at least one interconnect has a surface roughness that is in a range of approximately 1-3 micrometers.

Another example provides a method for fabricating a substrate. The method forms at least one dielectric layer. The method forms a plurality of interconnects in or over the at least one dielectric layer, wherein at least one interconnect has a surface roughness that is in a range of approximately 1-3 micrometers.

BRIEF DESCRIPTION OF THE DRAWINGS

Various features, nature and advantages may become apparent from the detailed description set forth below when taken in conjunction with the drawings in which like reference characters identify correspondingly throughout.

DETAILED DESCRIPTION

Figure 1:
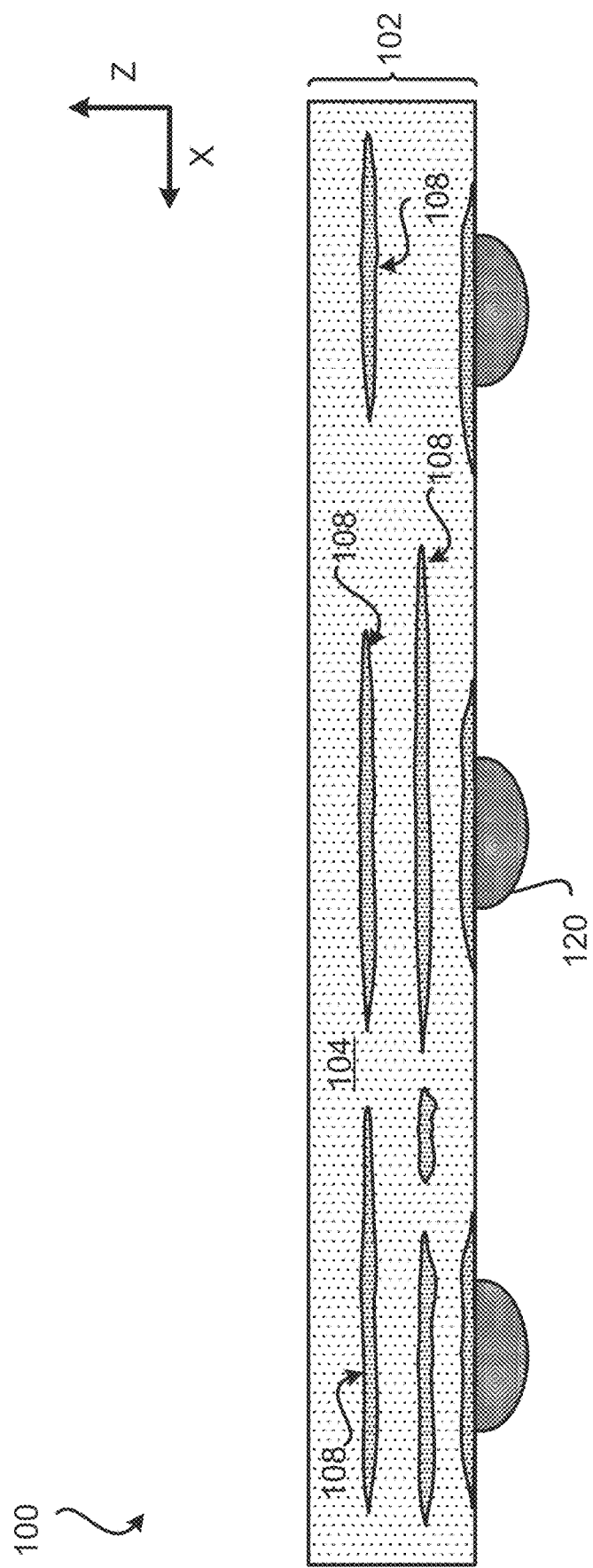
FIG. 1 illustrates a profile view of a post-fabrication substrate with lens-shaped interconnects or other non-rectangular interconnects.

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes, in some examples, a package that includes an integrated device, a substrate coupled to the integrated device, and an encapsulation layer coupled to the substrate. The encapsulation layer encapsulates the integrated device. The substrate includes at least one dielectric layer and a plurality of interconnects located in the at least one dielectric layer, wherein at least one of the interconnects has a substantially rectangular side cross-section. By a substantially rectangular cross-section, it may mean that the side cross-section of the interconnect closely approximates an idealized rectangle with 90-degree right angles and thus more closely approximates an idealized rectangle.

It should be understood that the interconnects with substantially rectangular cross-sections discussed may not have perfect right angle corners and, due to inherent variations in fabrication procedures and materials used, some post-fabrication interconnects will more closely approximate an idealized rectangle in cross-section than others. Moreover, as the interconnects often comprise sintered forms of pastes that initially include conducting grains of finite size, the post-fabrication interconnects may have fairly grainy surfaces (at least on a microscopic level). Hence, the term substantially rectangular cross-section does not imply that the cross-section may not be somewhat grainy or uneven, at least on a microscopic level.

There are many ways in which a substantially rectangular side cross-section may be quantified and distinguished from side cross-sections that are not substantially rectangular. Herein, in some examples, a substantially rectangular side cross-section is distinguished from other rectangular side cross-sections based on the notion of a corner radius. Corner radius is discussed in detail below but, briefly, the smaller the corner radius of a rectangle, the sharper its corners. A corner radius of zero corresponds to a perfectly sharp 90-degree angle (and hence a rectangle where each of the corner radii is zero corresponds to a perfect rectangle). A relatively small (but non-zero) corner radius corresponds to a fairly sharp corner (though not quite 90-degrees). A relatively larger corner radius corresponds to a less sharp corner. That is, the larger the corner radius, the less sharp the corner. Hence, the sharpness of a corner can be quantified by its corner radius. A sharp corner thus may be defined as a corner with a corner radius below a suitable threshold value, where the threshold value is chosen to distinguish a relatively sharp corner from a relatively blunt corner.

Note that if a structure is composed of grains and the grain size is large compared to the other dimensions of the structure, then the graininess of the structure may prevent the structure from having a sharp corner. Indeed, such structures may not have "corners" at all. Hence, the notion of the corner radius is not applicable to all possible structures and all degrees of graininess. Below, the concept of an effective shape is described, which may be used in connection with interconnects that are too grainy to have a well-defined corner radius. Such effective shapes may have at least one effective corner radius.

Herein, interconnects are described with rectangular side cross-sections wherein at least one corner of the cross-section has a non-zero corner radius that is less than a corner radius threshold representative of a sharp corner. In some illustrative examples, each of the four corners of the exemplary interconnects has a non-zero corner radius that is less than the threshold value. Thus, the side cross-section of the interconnect may be substantially rectangular, as opposed to uneven oblong or lens-shaped cross-sections.

Interconnects with side cross-sections that have rectangular shapes provide better RF performance than lens-shaped interconnects of the type shown in FIG. 1. The interconnects described herein can have other advantageous characteristics beyond providing shapes, such as lateral form stability, the aspect ratios approaching (or achieving) 1:1 (an "extreme" aspect ratio), and high resolutions.

Note that the corner radius is not the only manner by which substantially rectangular cross-sections can be distinguished from other cross-sections. For example, the evenness of the surfaces of the interconnects can be assessed. Additionally, the extent to which an interconnect has a width that remains constant across its cross-section can be assessed. Still further, the extent to which an interconnect deviates from an effective shape can be assessed. These processes are discussed in detail below.

Note also that insofar as RF skin effects are concerned, in some examples, a rectangular (cross-section) interconnect with slightly rounded corners can provide better performance than a rectangular (cross-section) interconnect with a perfectly sharp corner. Hence, in many of the examples described herein, the exemplary rectangular (cross-section) interconnects have a non-zero corner radius (e.g. the corners are sharp but are not perfect 90-degree corners). Note also that a square (cross-section) interconnect can provide better performance than a rectangular (cross-section) interconnect (assuming the same sharpness of the corners). Hence, some of the examples herein provide for generally square (cross-section) interconnects rather than rectangular (cross-section) interconnects, e.g. interconnects are described that have a cross-sectional width to thickness ratio of 1:1 Still further, insofar as surface roughness is concerned, a smoother surface may provide better performance than a rough or grainy surface. Some of the examples herein provide for interconnects that have generally smooth surfaces rather than rougher or grainier surfaces. Generally speaking, when fabricating interconnects, it may be advantageous to avoid singularities, sharp edges, roughness, and therefore losses due to skin depth.

Herein, in addition to describing packages that include interconnects that have substantially rectangular side cross-sections, exemplary fabrication processes and materials are described to achieve the substantially rectangular cross-sections. The exemplary fabrication processes and materials described herein can also provide for lateral form stability, the aspect ratios approaching (or achieving 1:1), and high resolutions.

Exemplary Package with Interconnect with Rectangular Cross-Sections

Figure 2:
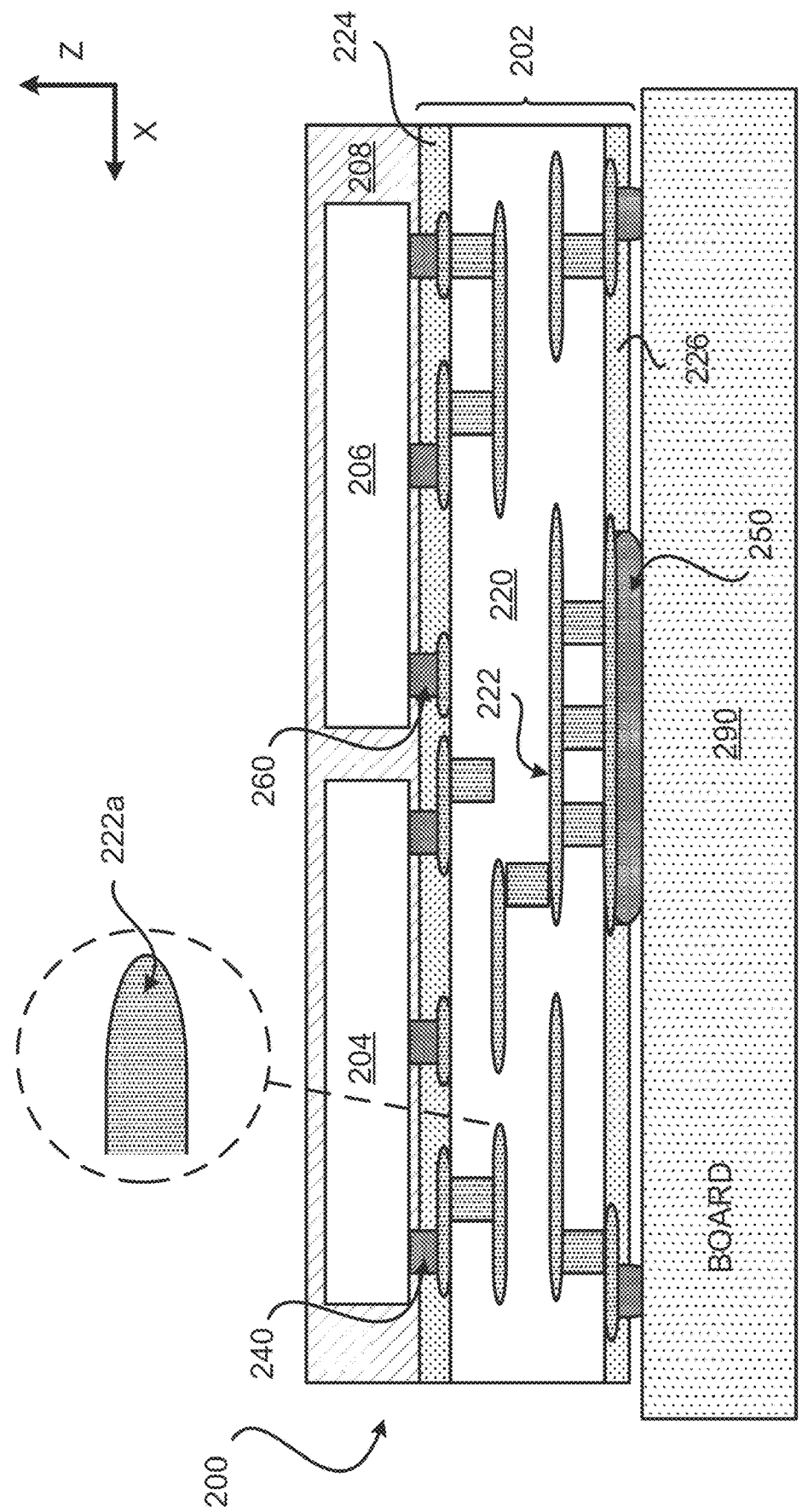
FIG. 2 illustrates a profile view of a package that includes a substrate having post-fabrication interconnects.

FIG. 2 illustrates a package 200 that includes a substrate 202, an integrated device 204, an integrated device 206, an encapsulation layer 208, a solder resist layer 224 and a solder resist layer 226. The package 200 may be coupled to a board 290 (e.g., printed circuit board) through a plurality of solder interconnects 250. The integrated device 204 is coupled to a first surface of the substrate 202 through a plurality of solder interconnects 240. The integrated device 206 is coupled to the first surface of the substrate 202 through a plurality of solder interconnects 260. The encapsulation layer 208 is formed over and coupled to the first surface of the substrate 202. The encapsulation layer 208 may encapsulate the integrated devices 204 and 206.

The substrate 202 includes at least one dielectric layer 220 and a plurality of interconnects 222. FIG. 2 illustrates that the plurality of interconnects 222 includes non-rectangular side cross-sections. For example, the interconnects 222a has a non-rectangular side cross section. The at least one dielectric layer 220 may include ceramic. The plurality of interconnects 222 may have non-rectangular side cross sections because of the fabrication process used to fabricate the plurality of interconnects 222 in the at least one dielectric layer 220 that includes ceramic.

Figure 3:
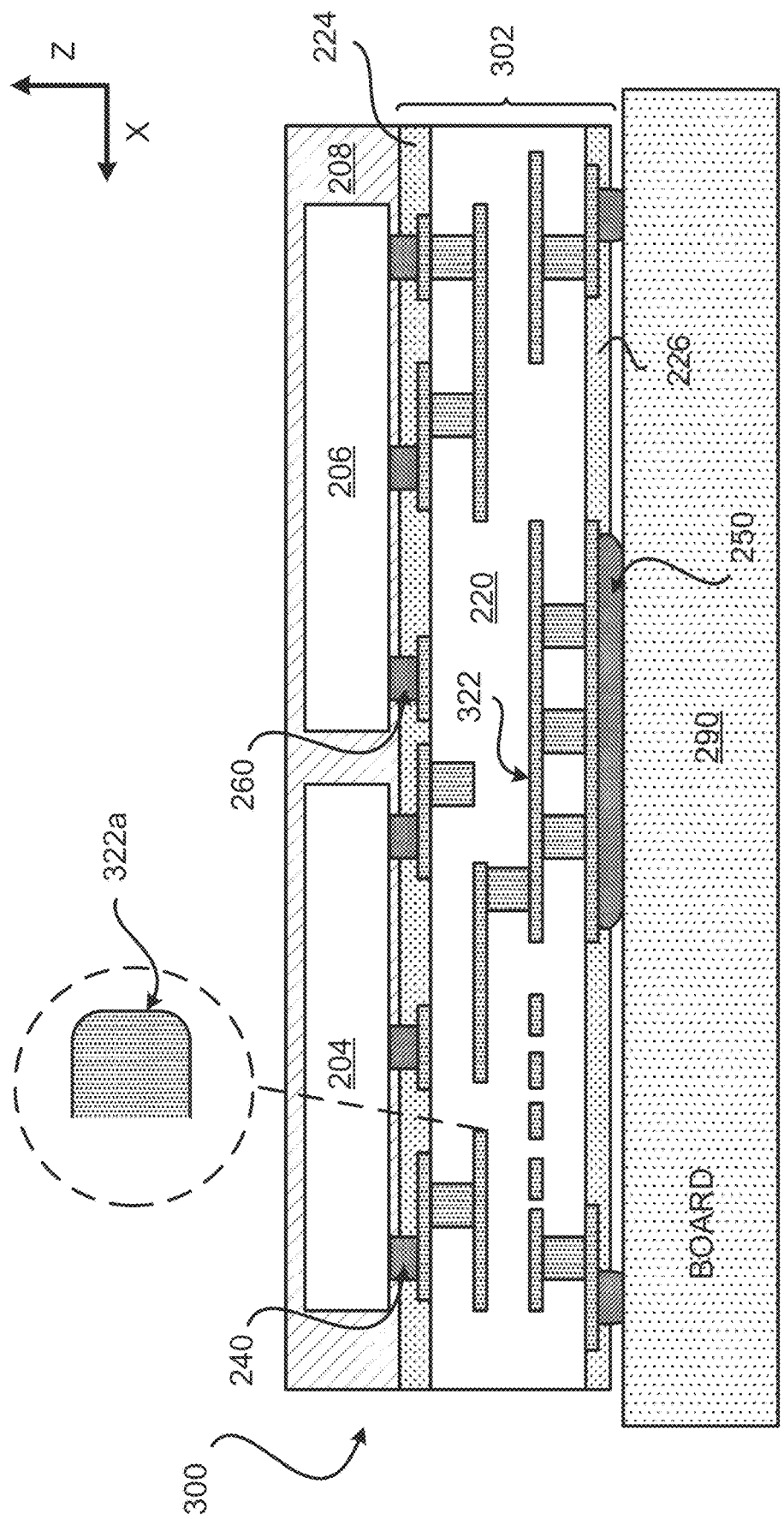
FIG. 3 illustrates a profile view of a package that includes a substrate having post-fabrication interconnects with substantially rectangular side cross-sections.

FIG. 3 illustrates a profile view of a package 300 that includes a substrate that comprises a plurality of interconnects where at least one interconnect has a substantially rectangular side cross-section, rather than a substantially oblong or substantially lens-shaped side cross-sections (where a rectangular cross-section includes square cross-sections). For example, the cross-sections of the interconnects have corners where each corner has a corner radius less than a corner radius threshold. The corner radius threshold is discussed in more detail below. The package 300 is similar to the package 200, and may include similar components as the package 200.

FIG. 3 illustrates a package 300 that includes a substrate 302, the integrated device 204, the integrated device 206, the encapsulation layer 208, a solder resist layer 224 and a solder resist layer 226 and/or buffer layer polymer. The package 300 may be coupled to the board 290 through the plurality of solder interconnects 250. The integrated device 204 is coupled to a first surface of the substrate 302 through a plurality of solder interconnects 240. The integrated device 206 is coupled to the first surface of the substrate 302 through a plurality of solder interconnects 260. The encapsulation layer 208 is formed over and coupled to the first surface of the substrate 302. The encapsulation layer 208 may encapsulate the integrated devices 204 and 206. The encapsulation layer 208 may be a means for encapsulation.

The substrate 302 includes at least one dielectric layer 220 and a plurality of interconnects 322. The substrate 302 may also include the solder resist layer 224 and the solder resist layer 226 and buffer layer polymer. FIG. 3 illustrates that the plurality of interconnects 322 includes substantially rectangular side cross-sections. For example, the interconnects 322a (e.g., pad, trace) has a substantially rectangular side cross section. The at least one dielectric layer 220 may include ceramic. The plurality of interconnects 322 may have a substantially rectangular side cross sections because of the fabrication process used to fabricate the plurality of interconnects 322 described below in at least FIGS. 4-5, 18-19 and 20A-20B of the disclosure. The term substantially rectangular is further defined below.

The plurality of interconnects 322 is located (e.g., formed) in and/or over the at least one dielectric layer 220. The plurality of interconnects 322 may comprise a means for interconnection. At least one interconnect of the plurality of interconnects 322 has a substantially rectangular side cross-section. That is, at least one interconnect 322 has a side cross-section where each corner has a corner radius (e.g., concave corner radius) that is less than the corner radius threshold so that the interconnects 322 each have cross-sections that more closely approximate an ideal rectangular shape than the interconnects of FIG. 1. The corner radius may be a non-zero corner radius. Corner radius and corner radius threshold are further illustrated and described below in at least FIG. 6.

The solder resist layer 224 or buffer layer is located over a first surface (e.g., integrated device facing surface, top surface) of the substrate 302. For example, the solder resist layer 224 may be formed over and coupled to the at least one dielectric layer 220. The solder resist layer 226 is located over a second surface (e.g., board facing surface, bottom surface) of the substrate 202. For example, the second solder resist layer 226 may be formed over and coupled to a bottom of the dielectric layer 220. In some implementations, the solder resist layer 224 and/or the solder resist layer 226 may be optional.

The encapsulation layer 208, if provided, may be coupled to a first surface (e.g., integrated device facing surface, top surface) of the substrate 302. The encapsulation layer 208 may be formed over the solder resist layer 224 of the substrate 202. The encapsulation layer 208 may be coupled to the substrate 202 such that the encapsulation layer 208 encapsulates the integrated device 204 and/or the integrated device 206. The encapsulation layer 208 may include a mold, a resin, an epoxy and/or polymer. The encapsulation layer 208 may be a means for encapsulation.

An integrated device (e.g., 204, 206) may include a die (e.g., bare die). The integrated device may include a radio frequency (RF) device, an analog device, a passive device, a filter, a capacitor, an inductor, an antenna, a transmitter, a receiver, a surface acoustic wave (SAW) filters, a bulk acoustic wave (BAW) filter, a light emitting diode (LED) integrated device, a silicon (Si) based integrated device, a silicon carbide (SiC) based integrated device, a GaAs based integrated device, a GaN based integrated device, a memory, power management processor, and/or combinations thereof.

Figure 4:
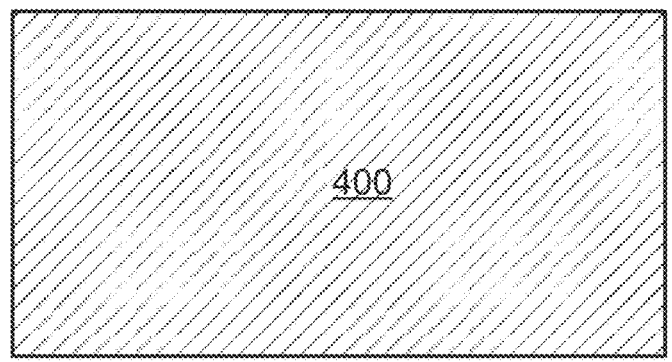
FIG. 4 illustrates an exemplary sequence for fabricating a substrate having interconnects with rectangular shaped side cross-sections.
Figure 4:
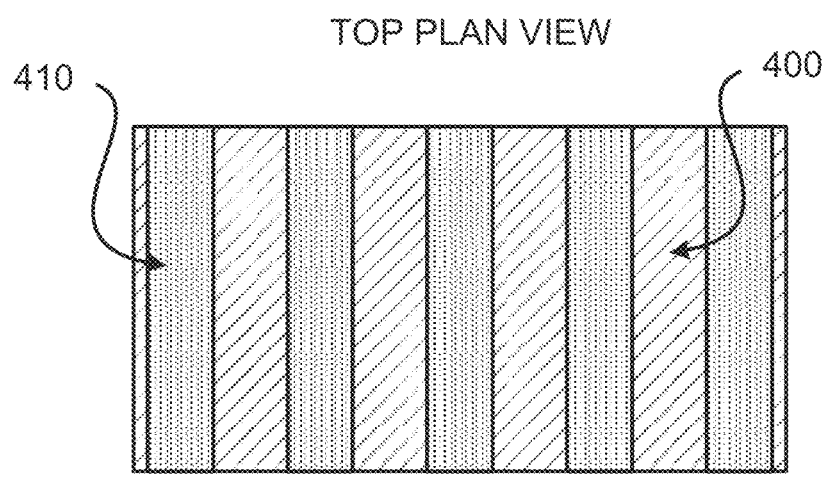
Figure 4:
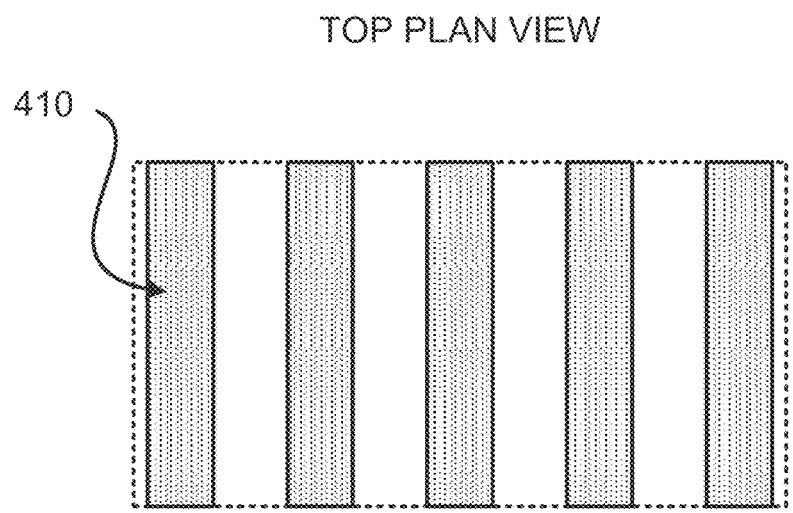
Figure 4:
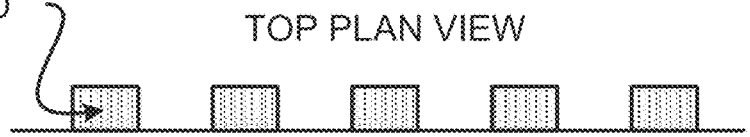
Figure 5:
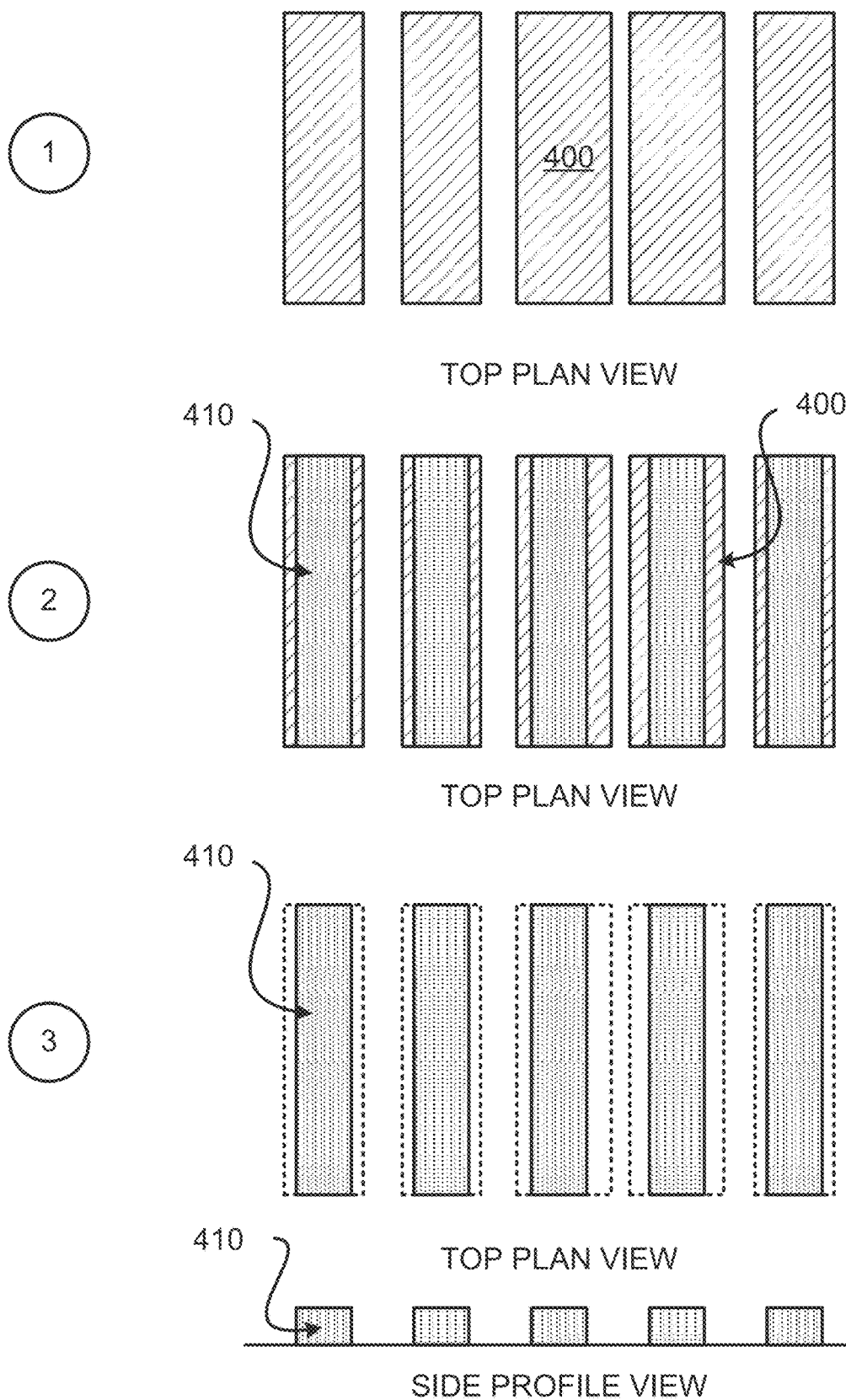
FIG. 5 illustrates an exemplary sequence for fabricating a substrate having interconnects with rectangular shaped side cross-sections.

As will be further described below, interconnects of a substrate may be formed from a paste that includes a metal and a polymer. The hardening of the paste (e.g., hardening of the polymer of the paste), prior to the sintering and/or firing process, helps provide substrates with interconnects having rectangular side cross sectional shapes. FIGS. 4 and 5 illustrate exemplary sequences of part of the process for fabricating an interconnect with rectangular side cross-sections. A more detailed process of fabricating substrates with interconnects having rectangular cross-sectional shapes, cross-sectional shapes with smaller corner radii, improved surface roughness and/or improved evenness in the thickness are further described below in at least FIGS. 18-19, 20A-20B, 21, 22 and 23A-23B.

FIG. 4 illustrates an exemplary sequence for providing or fabricating a substrate that includes interconnects with substantially rectangular side cross-sections. In some implementations, the sequence of FIG. 4 may be used to provide or fabricate the substrate 302 of FIG. 3, or other substrates described in the disclosure.

The sequence of FIG. 4 may combine one or more stages in order to simplify and/or clarify the sequence for providing or fabricating the substrate. In some implementations, the order of the processes may be changed or modified. In some implementations, one or more of processes may be replaced or substituted without departing from the scope of the disclosure. As will be further described below, a tape casting process may be used to form the substrate.

Stage 1 illustrates a state after a paste 400 is applied. The paste 400 may include an electrically conductive material (or, in some examples, a non-electrically conductive material) and a polymer. In this example, the polymer includes a negative tone photo polymer. The paste 400 may be a composite material. A screen printing process may be used to form the paste 400. The paste 400 may be formed over a dielectric layer.

Stage 2 illustrates a state after light (e.g., Ultraviolet (UV)) exposure of portions of the paste 400 to harden portions of the paste 400. The hardened portion 410 of the paste 400 may be hardened through a mask based process or a direct imaging process, which is described below in further details in at least FIGS. 18-19. The hardening of the paste 400 may define interconnects with rectangular cross-sectional shapes. The hardening the paste 400 (e.g., hardening of the polymer) to define interconnects improves the structural stability of the paste 400, which makes the paste 400 hold its shape better, so that when the paste 400 is eventually sintered and/or fired (with the dielectric layers), the resulting interconnects from the paste 400 has rectangular cross-sectional shapes (or cross-sectional shapes with smaller corner radii) because the paste 400 has maintained its rectangular cross-sectional shape when the sintering and/or firing begins. Without the hardening of the paste 400, prior to the sintering and/or firing of the paste 400, some portion of the side wall of the unhardened paste 400 will settle to its side and thus lose some of its rectangular shape and/or predefined shape. Therefore, when the sintering and/or firing of the unhardened paste begins, the paste 400 that defines the interconnect has already lost its rectangular shape. The end result is that after the sintering and/or firing of the unhardened paste, the interconnects do not have rectangular cross-sectional shapes. In addition to providing rectangular cross-sectional shapes and/or cross-sectional shapes with smaller corner radii, the hardening of the paste 400 helps provide interconnects with improved surface roughness and improved evenness in the thickness of the interconnects. These aspects and properties of the interconnects are further described below.

Stage 3 illustrates a state after removal of portions of the paste 400 that have not been hardened leaving behind the hardened portion 410 of the paste 400. The un-hardened portion of the paste 400 may be removed through a washing process. The hardened portion 410 that is left behind may define interconnects for the substrate.

The above stages may be repeated for each layer of a substrate. FIG. 4 illustrates an example where the paste includes a negative tone photo polymer. When a positive tone photo polymer is used, the results may be reversed. For example, with a positive tone photo polymer, portions that are exposed the light (e.g., UV light) are removed and portions that are not exposed to the light (e.g., UV light) are not removed.

FIG. 5 illustrates an exemplary sequence for providing or fabricating a substrate that includes interconnects with substantially rectangular side cross-sections. In some implementations, the sequence of FIG. 5 may be used to provide or fabricate the substrate 302 of FIG. 3, or other substrates described in the disclosure.

The sequence of FIG. 5 may combine one or more stages in order to simplify and/or clarify the sequence for providing or fabricating the substrate. In some implementations, the order of the processes may be changed or modified. In some implementations, one or more of processes may be replaced or substituted without departing from the scope of the disclosure. As will be further described below, a tape casting process may be used to form the substrate.

Stage 1 illustrates a state after a paste 400 is applied. The paste 400 may include an electrically conductive material and a polymer. In this example, the polymer includes a negative tone photo polymer. The paste 400 may be composite material. A screen printing process may be used to form the paste 400. The paste 400 may be formed over a dielectric layer. The paste 400 may be applied such that a rough outline or a rough design of the interconnects are formed over the dielectric layer.

Stage 2 illustrates a state after light (e.g., UV) exposure of portions of the paste 400 to harden portions of the paste 400. The hardened portion 410 of the paste 400 may be hardened through a mask based process or a direct imaging process, which is described below in further details in at least FIGS. 18-19. As mentioned above, the hardening of the paste 400 may define interconnects with rectangular cross-sectional shapes. The hardening the paste 400 to define interconnects improves the structural stability of the paste 400, which makes the paste 400 hold its shape better, so that when the paste 400 is eventually sintered and/or fired (with the dielectric layers), the resulting interconnects from the paste 400 has rectangular cross-sectional shapes because the paste 400 has maintained its rectangular cross-sectional shape when the sintering and/or firing begins.

Stage 3 illustrates a state after removal of portions of the paste 400 that have not been hardened leaving behind the hardened portion 410 of the paste 400. The un-hardened portion of the paste 400 may be removed through a washing process. The hardened portion 410 that is left behind may define interconnects for the substrate.

The above stages may be repeated for each layer of a substrate. FIG. 5 illustrates an example where the paste includes a negative tone photo polymer. When a positive tone photo polymer is used, the results may be reversed. For example, with a positive tone photo polymer, portions that are exposed the light (e.g., UV light) are removed and portions that are not exposed to the light (e.g., UV light) are not removed.

Figure 6:
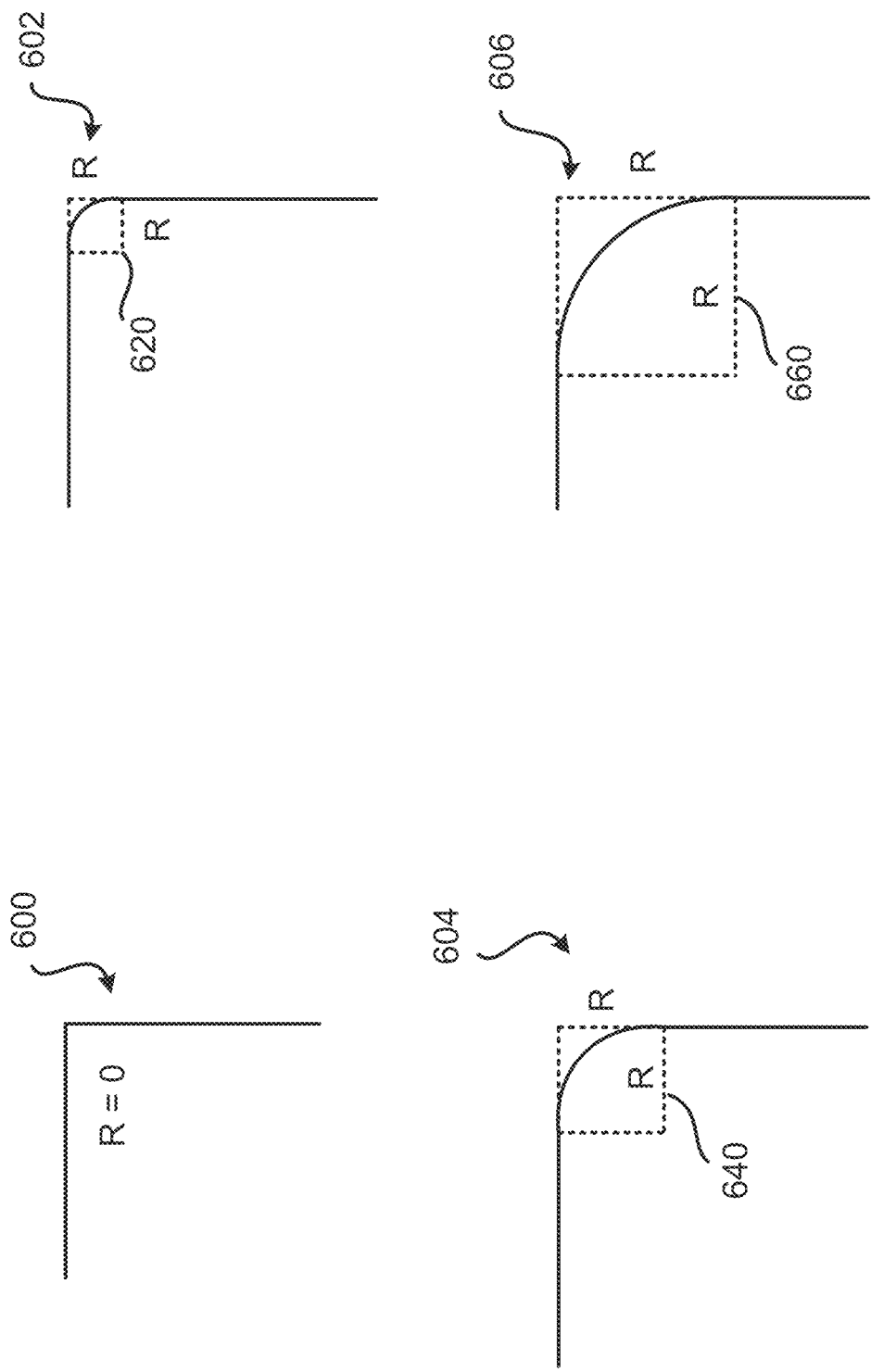
FIG. 6 illustrates profile views of various corners having different corner radii.

FIG. 6 illustrates various exemplary rounded corners, each with a different corner radius. The corners may represent corners of side cross sections of an interconnect. The corner radius illustrated in FIG. 6 may have a unit of measurement or may be unitless (or dimensionless). In the instance where the corner radius is unitless (or dimensionless), the corner radius may represent a ratio with respect with another measurement of the interconnects. Examples of unitless corner radius are further illustrated and described in at least FIGS. 13 and 14. A first corner 600 has a corner radius of zero (0). In such an example, the corner would have a 90-degree corner. A second corner 602 has a corner radius 620. A third corner 604 has a corner radius 640. The corner radius 640 is greater than the corner radius 620. The corner 606 has a corner radius 660. The corner radius 660 is greater than the corner radius 640. The various corner radii (e.g., 620, 640, and 660) may be specified in terms of micrometers or less, or may be unitless. A threshold value for a corner radius may be specified to specify whether an interconnect with a corner radius is substantially rectangular. In some implementations, when one or more (e.g., all) corners of the interconnect has a corner radius that is less than a threshold value, the interconnect may be deemed to have a side cross-section that is substantially rectangular.

Note that an interconnect having a rectangular side cross-section where each corner has a corner radius below the threshold is deemed to have a substantially rectangular side cross-section. That is, a substantially right-angled corner may be defined as a corner that has a corner radius below a particular threshold and a substantially rectangular cross-section may be defined as a rectangular cross-section where each corner has a corner radius below the threshold. Different implementations may specific different threshold values for the corner radius. As will be further described below a threshold corner radius may be approximately 2 micrometers (µm) or less (e.g., between approximately 0.5 and 2 micrometers). In some implementations, for at least one interconnect (e.g., from the plurality of interconnects 322) two or more corners of the interconnect have a corner radius that is approximately 2 micrometers or less (e.g., in a range of about 0-2 micrometers). In some implementations, for at least one interconnect (e.g., from the plurality of interconnects 322) all the corners of the interconnect have a corner radius that is approximately 2 micrometers or less. In some implementations, at least one corner radius may be a non-zero corner radius. For example, at least one corner radius of at least one interconnect is greater than zero, but equal to 2 micrometers or less.

For a substrate where, for example, interconnects are traces that have a side cross-sectional width of 20 µm and a height of 20 µm (as measured in a X-Z plane or a Y-Z plane), an exemplary threshold value for the corner threshold may be 1 µm, so that a trace having corner radii no larger than 1 µm is considered a substantially rectangular trace, whereas a trace having corner radii greater than 1 µm is not considered a substantially rectangular trace. In some examples, the thickness of the sintered paste is >6-8 µm and so a corner radii of 1 µm is more or less rectangular. In other examples, traces may have a side cross-sectional width greater than 20 µm (width resolution), and can be several mm or even cm. The height (Line Thickness) may be in the range of 5 µm up to 15 µm. Note that not all of traces are RF relevant, therefore, for "ground" structures a thickness of 5 µm is appropriate as well.

As noted above, interconnects with side cross-sections that have rectangular shapes provide better RF performance than lens-shaped interconnects (for at least some applications). Hence, for at least some applications, a rectangular interconnect with a relative sharp corner (as in 602) can provide satisfactory performance, whereas interconnects with less sharp (more blunt) corners (as in 606) may not provide satisfactory performance Thus, in at least some examples, an interconnect having a non-zero corner radius below the threshold may be satisfactory, whereas an interconnect having a corner radius greater than or equal to the threshold may not be satisfactory.

Otherwise routine experimentation or analysis may be performed to determine (for a particular application and a particular package) a threshold that distinguishes a sufficiently sharp corner (to achieve, e.g., satisfactory RF performance) from one that is not sufficiently sharp (and hence does not achieve, e.g. satisfactory RF performance). In some examples, a threshold in a range of approximately 0.5 and 2 micrometers (µm) may be suitable for this purpose. In other examples, a different threshold may be appropriate. Both upper and lower corner radii thresholds may be specified, with the corners set to be sharp but not perfectly sharp (90 degree). In one example, the lower threshold specifies a corner radius of at least approximately 0.5 µm and the upper threshold specifies a corner radius of no more than approximately 2 µm to thereby specify a cross-sectional shape that has sharp but perfectly sharp corners (e.g. with corner radii that are small but non-zero). Note also that, generally speaking, package designs do not specify a corner radius for rectangular interconnects, as it is often assumed that a rectangular interconnect should have sharp 90° corners (and hence a corner radius of zero). Nevertheless, as a practical matter the resulting fabricated interconnects will be lens-shaped, as discussed above. As such, the corner radius is a useful measure of how much a fabricated interconnect deviates from its intended shape (at least for interconnects intended to have side cross-sections that are rectangular).

Figure 7:
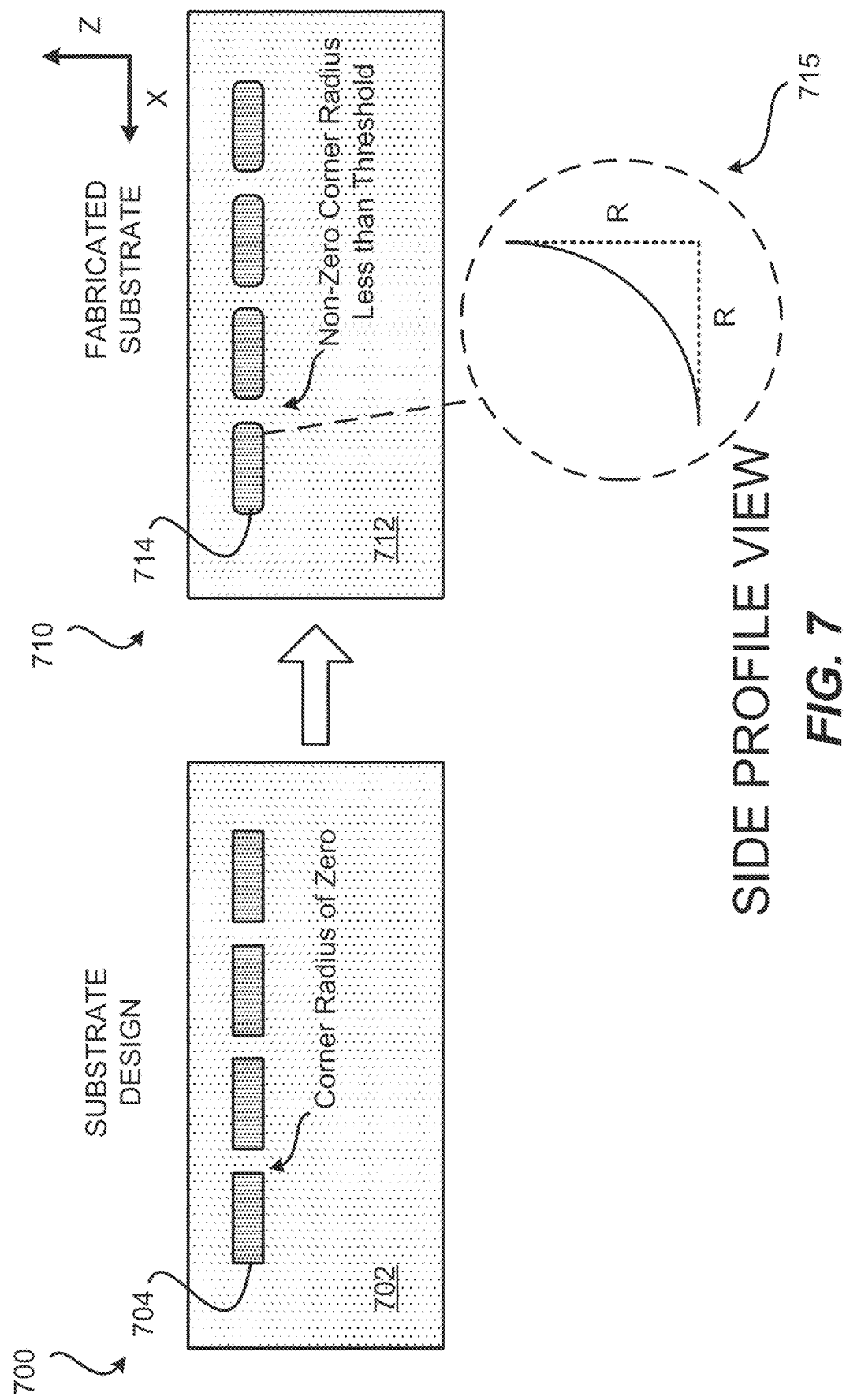
FIG. 7 illustrates a profile view of a substrate interconnect design that includes a rectangular interconnect along with a profile view of a corresponding fabricated version of the design, wherein the resulting interconnects are substantially rectangular (with only slightly rounded corners).

FIG. 7 illustrates an idealized design 700 for a substrate that includes a dielectric layer 702 and interconnect designs 704, which is intended to have a precise rectangular side cross-section, as shown. That is, the interconnect designs 704 is intended to have corners with corner radii of zero. FIG. 7 also illustrates a substrate 710 that includes a dielectric layer 712 and an interconnect 714, where the interconnect 714 is substantially rectangular and closely approximates the rectangular interconnect design 704. That is, the interconnect 714 has corners where each corner has a non-zero corner radius that is less than a suitable threshold. An inset 715 is provided that shows one exemplary corner of interconnect 714.

Note that FIG. 7 is a stylized drawing provided to illustrate an interconnect with a substantially rectangular side cross-section. It is not necessarily a photographic representation of an actual resulting substrate, which as noted above, may have features that are somewhat grainy or uneven. Note also that the various corners of the interconnect 714 may have somewhat different corner radii due to fabrication and material variations. These variations may be due to the size of the grains of the metal paste, the polymer that is used with the metal paste, the temperatures that are used for sintering and/or firing. Similar considerations apply to other figures discussed herein.

Figure 8:
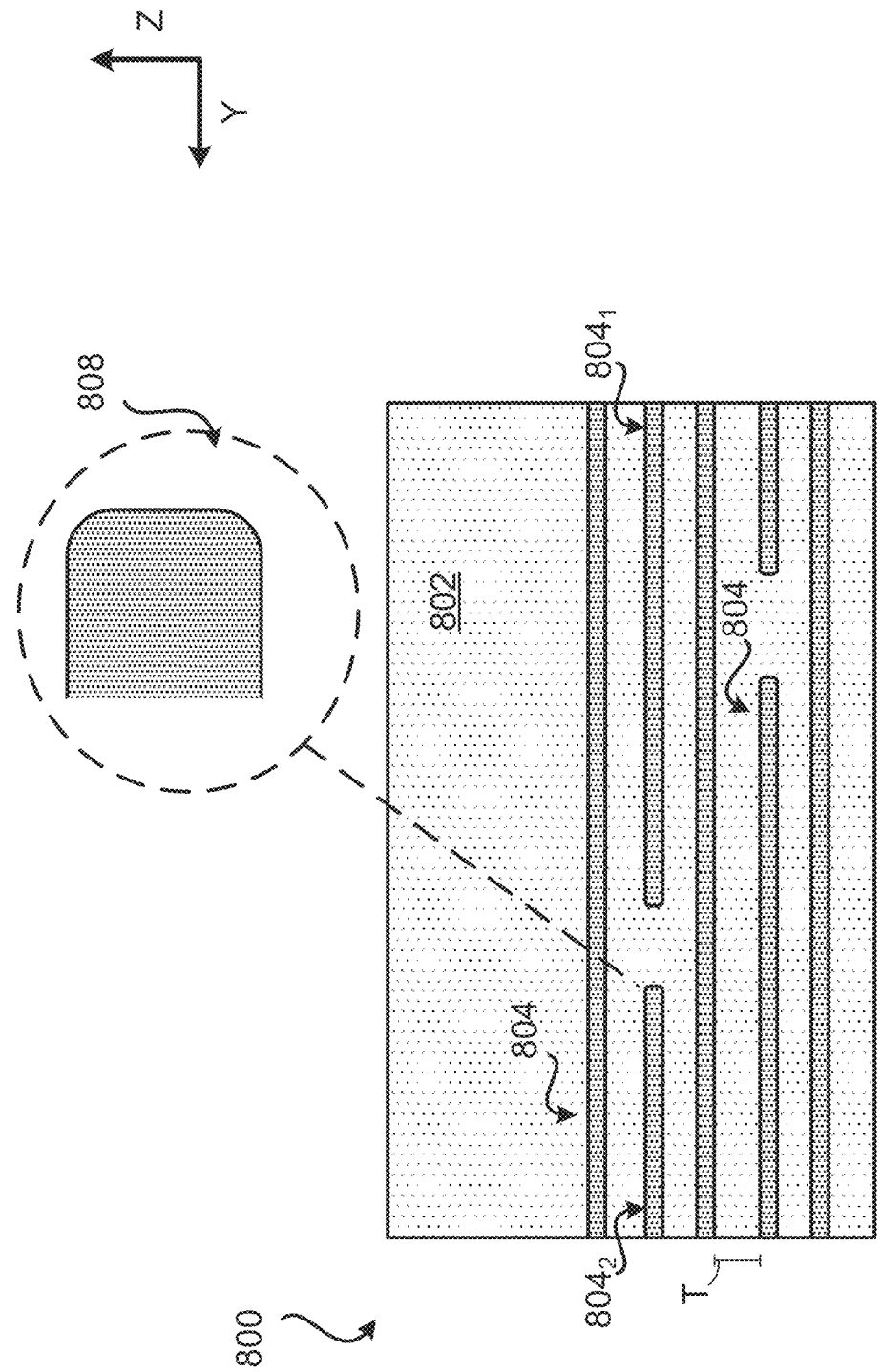
FIG. 8 illustrates a profile view of another substrate wherein the interconnects have substantially rectangular cross-sections (with only slightly rounded corners).

FIG. 8 illustrates another substrate 800 that includes a dielectric layer 802 and a plurality of interconnects 804, where each of the interconnects 804 has a substantially rectangular side cross-section. In this example, most of the interconnects 804 extend from one side of the substrate 800 to another. Some of the interconnects 804 are configured to provide openings between the end of one interconnect and the end of another interconnect. The ends of the interconnects 804$_1$ and 804$_2$ each have corners where each corner has a non-zero corner radius that is small (e.g. less than the threshold discussed above) so that the shape closely approximates an ideal rectilinear shape. An inset 808 is provided that shows the exemplary corners of the end of interconnect 804$_2$. FIG. 8 also illustrates an exemplary layer thickness (T) of dielectric layers between adjacent interconnects vertically along the Z axis. (Traces may be applied to the dielectric layers.) In some examples, a layer thickness of no more than 30 μm may be achieved, and, in other examples, a layer thickness in the range of approximately 10 μm (sintered) to 100 μm (sintered) may be achieved, and in still other examples, a range of 20 μm (sintered) to 30 μm (sintered) may be achieved. Note that thin dielectric layers are more challenging as compared to thick dielectric layers.

Figure 9:
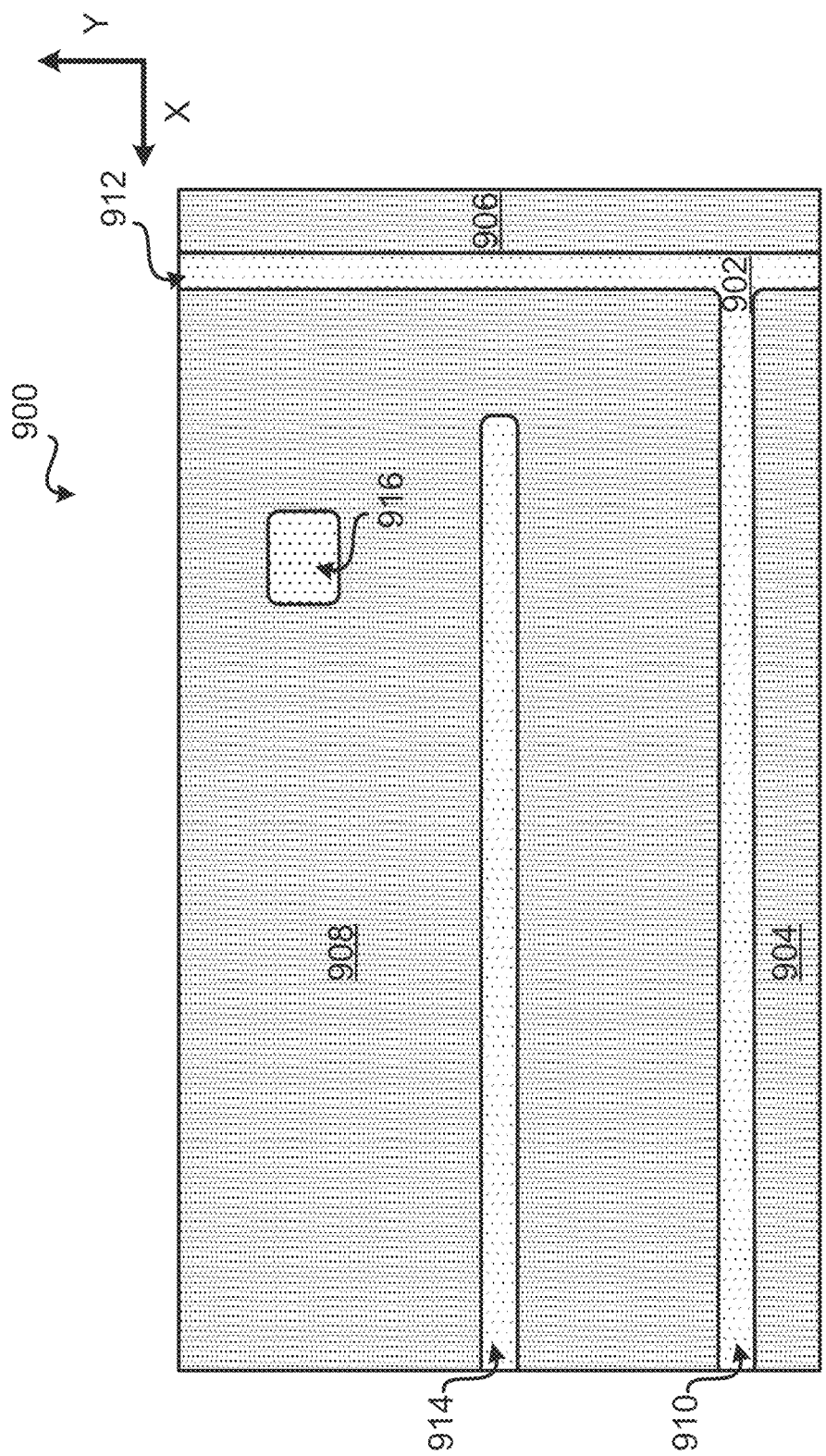
FIG. 9 illustrates a plan view of a layer of a substrate that includes several long narrow cutouts and one square cutout.

FIG. 9 illustrates yet another substrate 900 that includes a dielectric 902 and a plurality of interconnects 904, 906 and 908. Note that FIG. 9 provides a planar view of one layer of a substrate (rather than a profile view as in the preceding figures). In the example of FIG. 9, the three interconnects 904, 906 and 908 fill most of the available area, leaving only three long narrow cutouts, 910, 912, and 914, and one square cutout 916. As noted above, with screen-printing, it can be difficult to provide long narrow cutouts and small square cutouts tend to fill in due to surface tension of the material used to manufacture the layer. Thus, FIG. 9 illustrates the aforementioned lateral form stability. In this regard, the square cutout 916 retains its intended shape and does not close as may occur during screen-printing.

Figure 10:
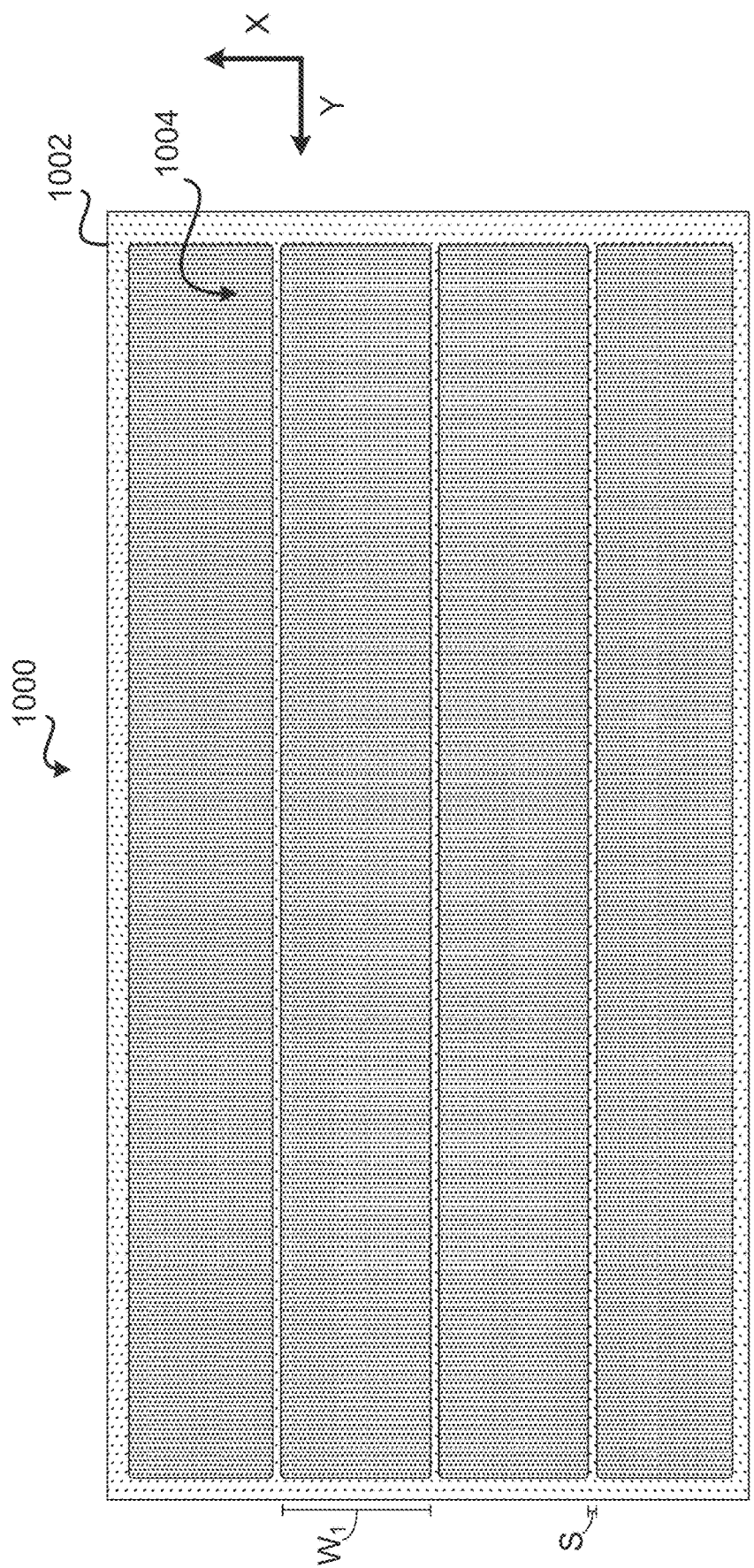
FIG. 10 illustrates a plan view of a layer of a substrate that includes several wide interconnects separated by narrow spacing.

FIG. 10 illustrates a substrate 1000 that includes a dielectric layer 1002 and a plurality of horizontal interconnects. As with FIG. 9, FIG. 10 provides a planar view of one layer of a substrate. In this example, a plurality of interconnects 1004 (aligned parallel with the X axis of the figure) each have widths W$_1$ and are separated from one another (by dielectric regions) with narrow spacings S, where a ratio of the width W$_1$ of the interconnects 1004 to the spacings S between the interconnects is 10:1. In one example, the width W$_1$ is 300 μm and the spacing S is 30 μm. Alternatively, similar interconnects may be provided but aligned parallel with the X axis of the figure. A single substrate may include some interconnects aligned parallel with the X axis and other interconnects aligned with the Y axis, as well as other interconnects with different shapes, spacings, and orientations.

Figure 11:
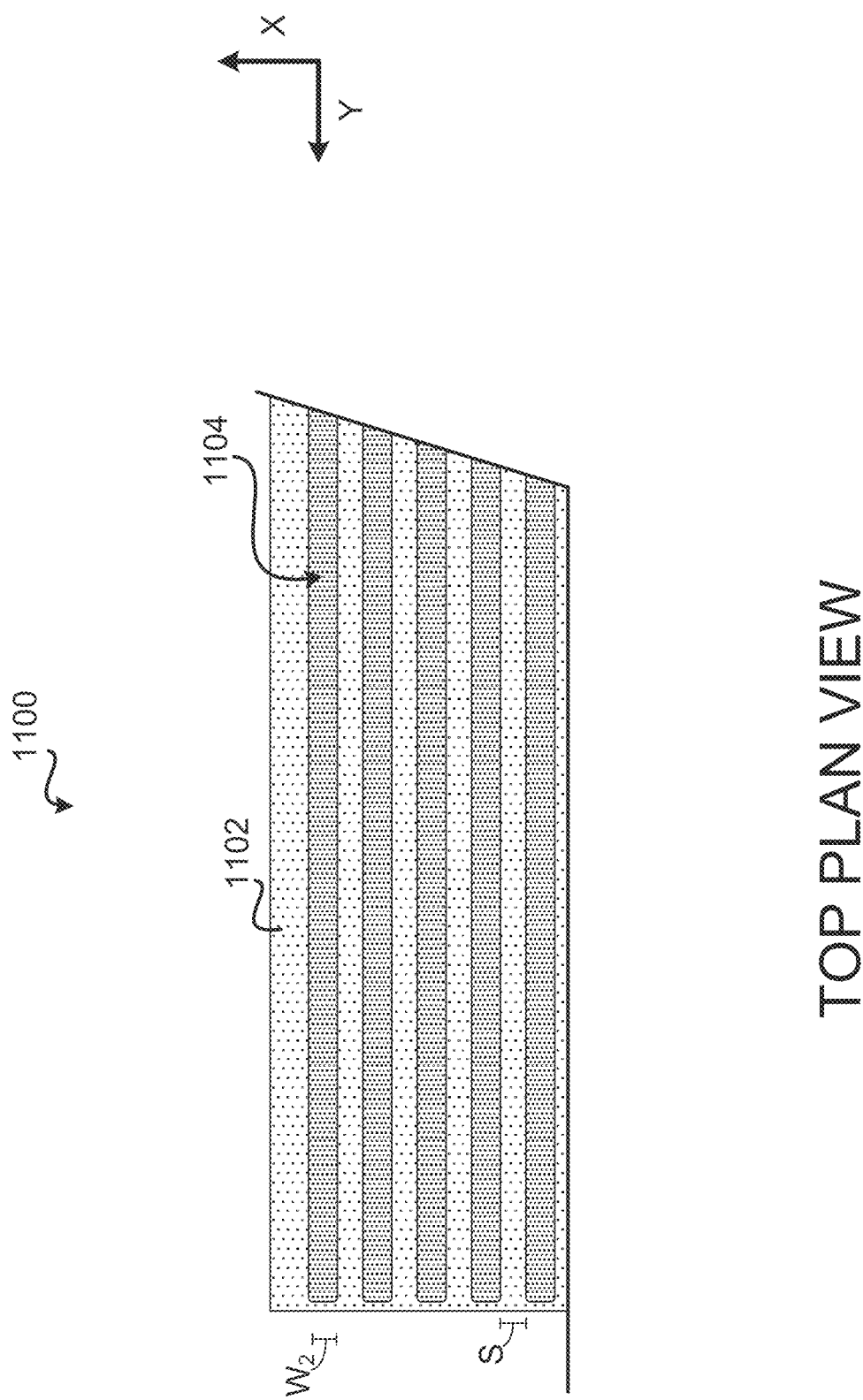
FIG. 11 illustrates a plan view of a portion of a layer of a substrate that includes several narrow interconnects separated by narrow spacing.

FIG. 11 illustrates a portion of a substrate 1100 that includes a dielectric layer 1102 and a plurality of horizontal interconnects. FIG. 11 provides a planar view of a portion of one layer of a substrate. In this example, a plurality of interconnects 1104 (aligned parallel with the X axis of the figure) each have widths W$_2$ and are separated from one another (by dielectric regions) with narrow spacings S, where a ratio of the width W$_2$ of the interconnects 1104 to the spacings S between the interconnects is 1:1. In one example, the width W$_2$ is 30 μm and the spacing S is 30 μm (e.g. 30/30). Alternatively, similar interconnects may be provided but aligned parallel with the X axis of the figure. In other examples, S/W values of 25/25 or 20/20 may be achieved. (See, FIG. 12 for an illustration of thickness, spacing and other parameters. Note also that a single substrate may include some interconnects aligned parallel with the X axis and other interconnects aligned with the Y axis, as well as other interconnects with different shapes and spacings.

FIGS. 10 and 11 thus illustrate high line/width resolution or accuracy, which may be difficult to achieve with screen-printing.

Figure 12:
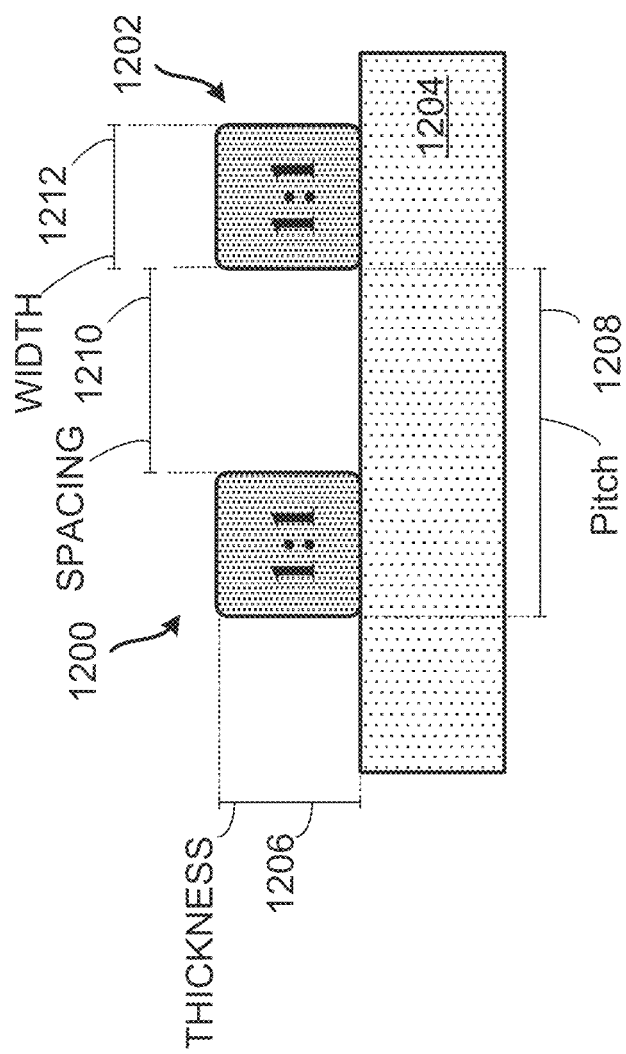
FIG. 12 illustrates a profile view of an interconnect having a cross-sectional aspect ratio of 1:1.

FIG. 12 illustrates a pair of interconnects 1200 and 1202 formed on a dielectric layer 1204 where the interconnects 1200 and 1202 both have a cross-sectional aspect ratio at or near 1:1 (or at least better than 1:2), which, as noted, may be difficult to achieve with screen-printing. An aspect ratio of 1:2 would mean a height to width ratio of 1:2. In some implementations, at least some of the interconnects (e.g., 322) described in the disclosure may have a height to width aspect ratio of approximately 1:2 or less. In some implementations, at least some of the interconnects (e.g., 322) described in the disclosure may have a height to width aspect ratio between approximately 1:2 and 1:1. This is an example of an "extreme" aspect ratio. FIG. 12 also illustrates various parameters than may be used to characterize the interconnects, including the thickness 1206, the pitch 1208, the space 1210 and the width 1212.

Figure 13:
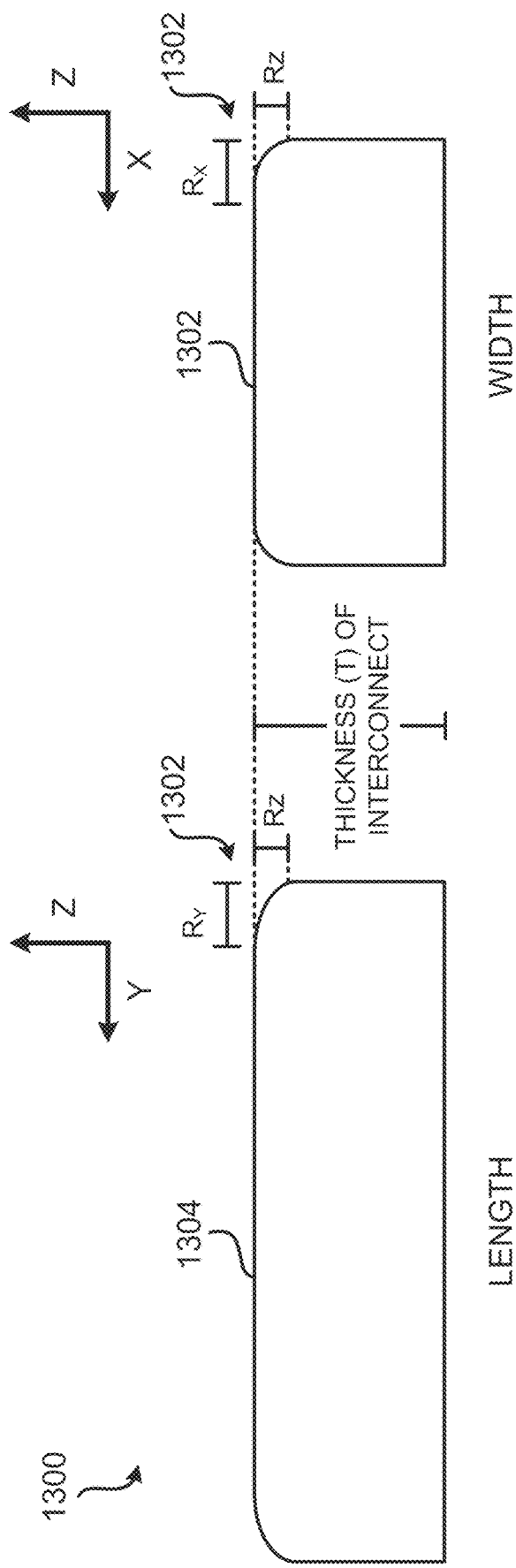
FIG. 13 illustrates a profile view of an interconnect having rounded top corners and particularly illustrating radius values that may be used to define a dimensionless corner ratio.

FIG. 13 illustrates corner radius values that may be used to define a "dimensionless" corner ratio. FIG. 13 illustrates an exemplary interconnect 1300 (in separate side cross-sections in the X-Z and Y-Z planes) where the interconnect 1300 has a rounded corner 1302. The rounded corner 1302 slopes downwardly relative to a top surface 1304 of the interconnect by a vertical distance R$_Z$. The rounded corner 1302 extends by a distance R$_X$ horizontally toward a center of the top surface 1304 (in the X-Z plane) and extends by a distance R$_Y$ horizontally toward the center of the top surface 1304 (in the Y-Z plane). Hence, the exemplary corner is curved in three dimensions and is characterized by radius values R$_X$, R$_Y$ and R$_Z$.

The sharpness of the corner 1302 of FIG. 13 can be characterized based on a ratio of one or more of these values to the thickness (T) of the interconnect. In one example, if $(100 \cdot (\frac{1}{3} (R_X + R_Y + R_Z)/T)) < 20\%$, the interconnect is considered to have sharp corner; otherwise the interconnect is considered to have a relatively blunt (non-sharp) corner. Other suitable threshold percentages may be used such as, for example, percentages in the range of 10%-30%. In another example, only the R$_X$ and R$_Z$ is used in the assessment (e.g. $(100 \cdot (\frac{1}{2} (R_X + R_Z)/T)) < 20\%$), or some other combination of the values is used. In another example, only the R$_Y$ and R$_Z$ is used in the assessment (e.g. $(100 \cdot (\frac{1}{2} (R_Y + R_Z)/T)) < 20\%$), or some other combination of the values is used. Moreover, in some examples, ratios may be defined relative to one of the other dimensions of the interconnect, such as its width in the X direction or its width in the Y direction. These are just some examples of ratios or other metrics that may be defined.

A ratio of one or more of the radius values (R$_X$, R$_Y$, and R$_Z$) to T (or to other suitable dimensions such as width in the X or Y directions) is referred to herein as a dimensionless corner ratio or a dimensionless corner radius. As such, the corner radius of an interconnect need not be a value that has a particular length (such as 1 μm) for comparison against a length-based threshold but may be expressed as a dimensionless value for comparison against a percentage-based threshold or other dimensionless threshold value. For example, a corner radius (R) for an interconnect may be a unitless value (Rz/T), (Rx/T), and/or (Ry/T).

Figure 14:
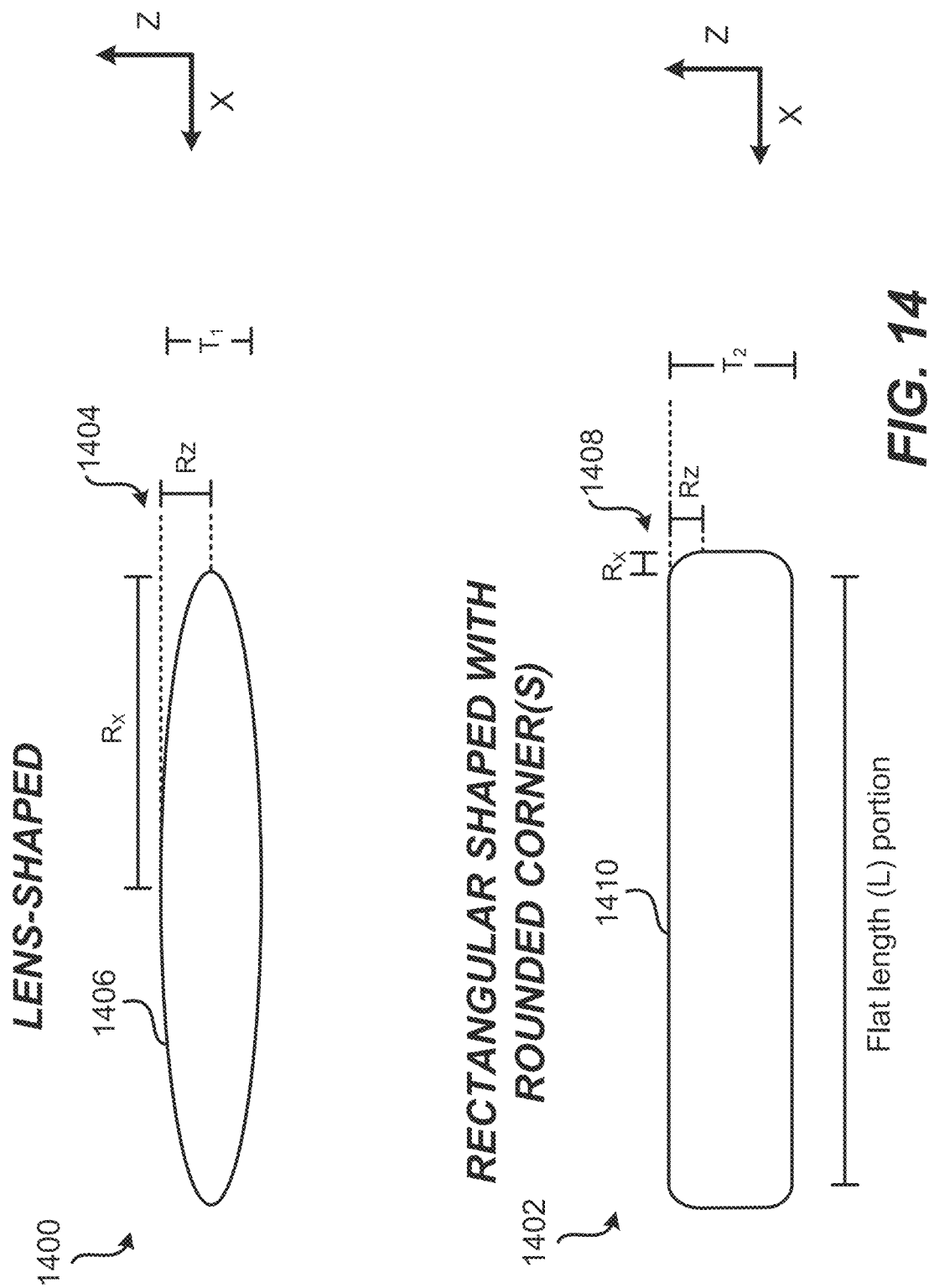
FIG. 14 illustrates a profile view of a lens-shaped cross-sectional interconnect and a rectangular cross-sectional interconnect having rounded top corners and again particularly illustrating radius values that may be used to define dimensionless corner ratios.

FIG. 14 illustrates an example where a dimensionless corner ratio may be used to distinguish between a lens-shaped interconnect 1400 (which may have poor RF characteristics because of its lens shape) and a rectangular shaped (or rounded rectangle) interconnect 1402 (with better RF characteristics). Both interconnects 1400 and 1402 are shown in side cross-sections in the X-Z and Y-Z planes. The lens-shaped interconnect 1400 has wide rounded corners 1404 that slope downwardly from a center of a top surface 1406 of the interconnect to a center of a side of the interconnect by a vertical distance $R_Z$. The corner 1404 also extends by a distance $R_X$ horizontally from the center of the top surface to the center of the side surface. As such, $R_X$ is equal to half of the thickness $T_1$ of the interconnect 1400, and $R_Y$ is equal to half of the width of the interconnect 1400 (along the X direction). A dimensionless corner ratio for the interconnect based on $R_X + R_Z$ thus may be computed as $(100 \cdot (\frac{1}{2} (R_X + R_Z)/T_1)) = 50\%$, which is far greater than the aforementioned exemplary threshold of 20%. In contrast, the rectangular shaped interconnect 1402 has sharper corners 1408 with much smaller $R_X$ and $R_Z$ values relative to the thickness $T_2$. In an example where $R_X = \frac{1}{10} T_2$ and $R_Z = \frac{1}{5} T_2$, the aforementioned dimensionless corner ratio thus may be computed as $(100 \cdot (\frac{1}{2} (R_X + R_Z)/T_2)) = 15\%$, which is below the exemplary threshold of 20%.

Further with regard to FIG. 14, the interconnect 1400 also illustrates that some interconnects can have a vertical thickness that varies substantially along a horizontal length of the interconnect. Other interconnects, such as interconnect 1402, have a vertical thickness that does not vary much along most of the horizontal length of the interconnect. A tolerance may be defined that distinguishes between the two type of interconnects. In one example, the tolerance is defined based on a percentage of the width or length of the interconnect that maintains its thickness (e.g. remain substantially flat). A tolerance of 80% means that at least 80% of the interconnect maintains its thickness (along the X or Y axes). Hence, an interconnect where only 50% of its width or length maintains its thickness is below the accepted tolerance (and hence is less likely to have satisfactory RF performance). An interconnect where 80% or more of its width or length maintains its thickness is within the accepted tolerance (and hence is more likely to have satisfactory RF performance).

With interconnect 1400, since it has a lens-shaped cross-section, its thickness varies continuously along its horizontal length from its maximum thickness $T_1$ to a thickness of zero at its ends. To the extent that any portion of top surface 1406 of interconnect 1400 might be regarded as substantially flat, that portion is far less than 80% of the total length or width. In contrast, interconnect 1402 maintains its thickness $T_2$ along most of its length. As shown in FIG. 14, the interconnect 1402 maintains its thickness $T_2$ along over 90% of its length. This is identified in the figure as flat length portion (L). Hence, with the tolerance defined at 80%, the interconnect 1402 is within the accepted tolerance.

Figure 15:
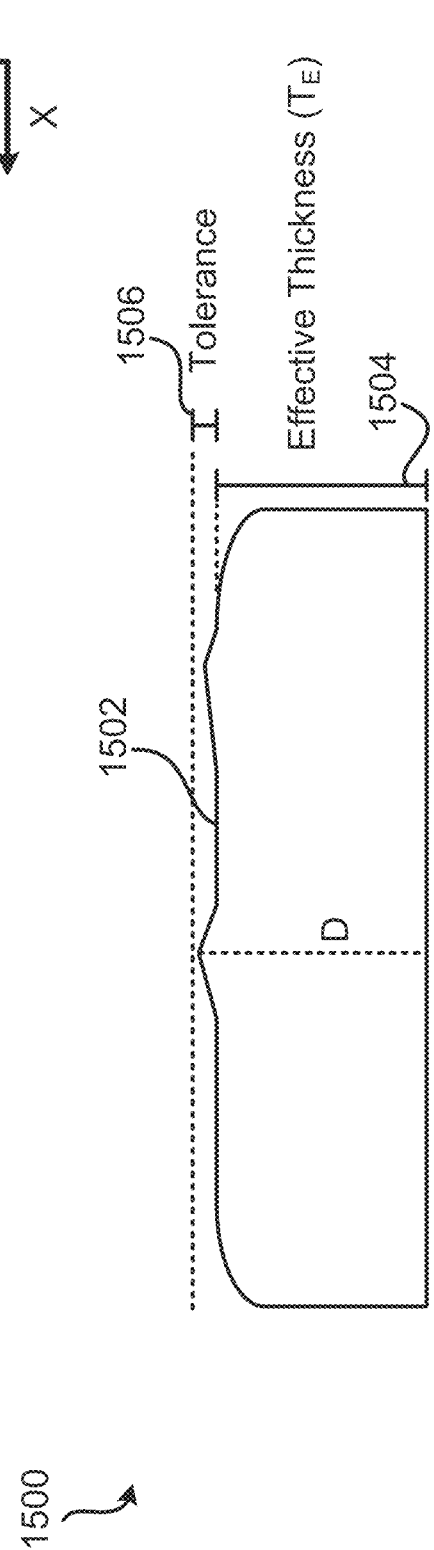
FIG. 15 illustrates a profile view of an interconnect having an uneven top surface.

FIG. 15 illustrates an exemplary interconnect 1500 (in side cross-section) that has an uneven, rough or grainy top surface 1502. The interconnect has an effective thickness 1504 representative of an average thickness of a central portion of the top surface 1502. FIG. 15 also illustrates a tolerance 1506 that defines a maximum permissible amount of unevenness relative to the top surface. The tolerance 1506 may be defined in terms of a percentage of the effective thickness, such as 10% of the effective thickness ($T_E$). For example, if the effective thickness 1504 is 10 μm, the tolerance then may between 1 and 2 μm. As such, if any portion of the uneven top surface exceeds the range of tolerance, the interconnect is deemed to be substantially uneven. In some implementations, Rz may define the roughness of a surface of an interconnect. The roughness of the surface of an interconnect may be defined differently. For example, the roughness of the surface of an interconnect may be defined by Ra (which may be an arithmetical mean deviation). The variation of the vertical thickness of an interconnect may be quantified as roughness (Ra). For example, Ra for a surface of an interconnect may be defined as $1/n \Sigma_{i=1}^{n} y_i$, where n is the number of measurements across a profile and $y_i$ is a vertical difference/vertical distance from a nominal surface of the interconnect. In some implementations, the roughness of the surface of an interconnect may be as low as 1.5 micrometers. Thus, Rz and/or Ra may be as low as 1.5 micrometers. In some implementations, Rz and/or Ra may be in a range of approximately 1.5-3 micrometers.

In the example of FIG. 15, none of the portions of the top surface exceed the tolerance and so the interconnect is deemed to be substantially even. In one aspect, a thickest portion of the interconnect (D) may be measured and compared to the effective thickness ($T_E$) 1504, and if D exceeds the effective thickness ($T_E$) 1504 by greater than the tolerance (e.g. 10%), the interconnect is deemed to be substantially uneven. For example, if $(100 \cdot (D/T_E) - 100) < 10\%$, the interconnect is considered substantially even; otherwise the interconnect is considered to be substantially uneven. Other suitable tolerances may be, for example, in the range of 5-15%. Because of the substantial variations in the thickness of the lens-shaped interconnect 1400 vs the lower variations in the thickness of the rectangular shaped interconnect 1402, the rectangular shaped interconnect has less skin effect loss relative to the skin effect loss of the lens shaped interconnect, which means the rectangular shaped interconnect 1402 provides better electrical performance than the lens-shaped interconnect 1400.

Figure 16:
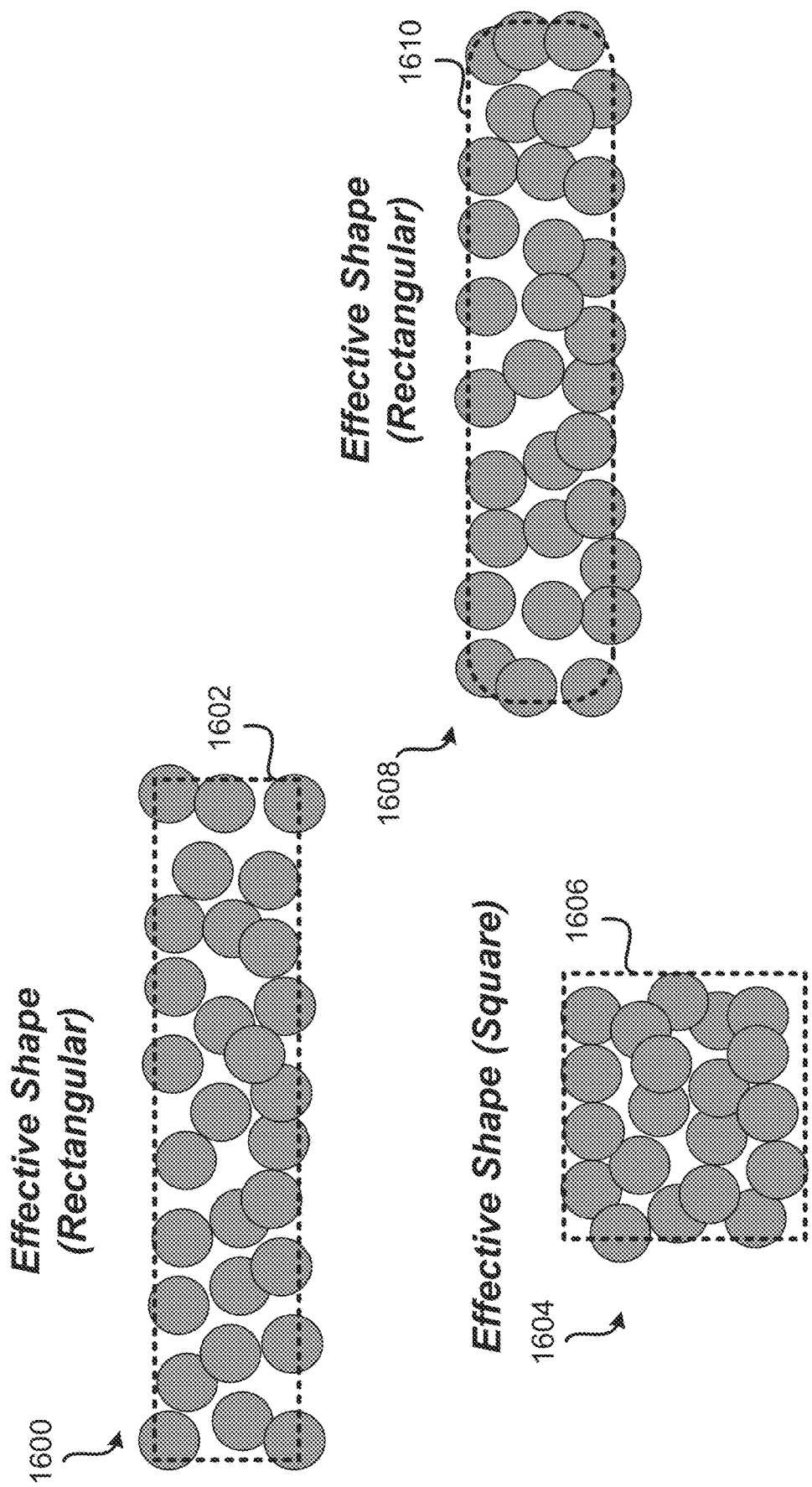
FIG. 16 illustrates a profile view of various effective shapes.

FIG. 16 illustrates various exemplary grainy interconnects (in side cross-section) and corresponding effective shapes (which may also be referred to as an analogous shape, a corresponding shape, or a cognate shape). An effective shape is a basic or simple geometrical shape that corresponds to a grainy or lumpy shape. A first interconnect 1600 corresponds to an effective shape that is rectangular 1602 (e.g. the interconnect has a side cross-section that is rectangular). A second interconnect 1604 corresponds to an effective shape that is square 1606 (e.g. the interconnect has a side cross-section that is square). A third interconnect 1608 corresponds to an effective shape that is oval 1610 (e.g. the interconnect has a side cross-section that is oval, or rectangular with rounded corners).

Effective shapes, as shown in FIG. 16, may be used to assess whether a grainy interconnect is substantially rectangular (for example) as opposed to a more oblong or skewed rectangle. In one example, an interconnect within a finished substrate is examined to determine its effective shape based on its cross-section and the size of the effective shape. That is, one distinguishes between an effective shape that is rectangular as opposed to circular, etc., and then measures its average width and thickness (for a rectangle). Having identified the effective shape and determined its average dimensions, an assessment then can be made as to the portion or percentage of the material of the interconnect that is within the boundary of the effective shape. For example, the number of grains that are within the boundary of the effective shape may be counted or otherwise quantified for comparison against the total number of grains. This may be expressed as a percentage (e.g. the percentage of grains within the effective shape boundary) for comparison against a suitable threshold. In one example, if at least 90% of the grains are within the effective shape boundary for a rectangular shape, then the interconnect is deemed to be substantially rectangular; otherwise it is not deemed substantially rectangular. In this manner, grainy interconnects, which may not have a well-defined corner radius, may be quantified and classified as substantially rectangular or not substantially rectangular. Similar considerations apply to other cross-sectional effective shapes, such as the others of FIG. 16. The corner radius and the corner radius threshold as described in the disclosure may be applied to the effective shape(s) described in FIG. 16.

Having described various different packages and substrate with interconnects having substantially rectangular side cross-sections, a method for fabricating a substrate will now be described below.

Exemplary Fabrication System

Figure 17:
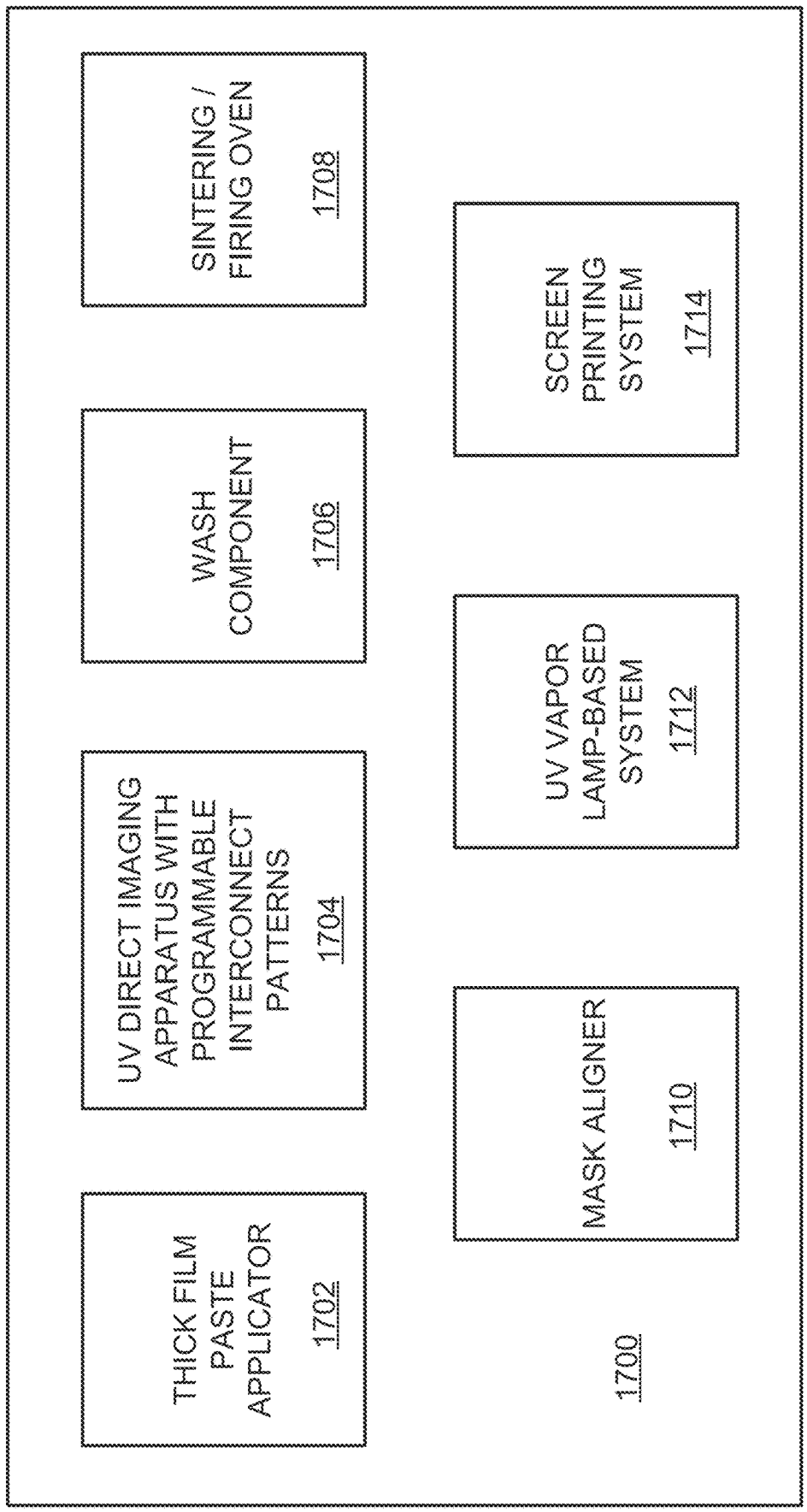
FIG. 17 illustrates ultraviolet (UV) light-based components that may be used to polymerize pastes to form interconnects with substantially rectangular side cross-sections.

FIG. 17 illustrates an exemplary block diagram of a device 1700 (e.g., apparatus, system) for fabricating a substrate having interconnects with substantially rectangular side cross-sections or for forming other substrates. In some implementations, the device 1700 of FIG. 17 may be used to fabricate at least a portion of the substrate of FIG. 3. However, the device 1700 may be used to fabricate other substrates described in the disclosure that have interconnects with substantially rectangular side cross-sections. As mentioned above, using light (e.g., UV) to harden a paste helps provide interconnects with substantially rectangular side cross-sections. The device 1700 illustrates, in block diagram form, components that may be used to fabricate the package of FIG. 3. Not all of the components are necessarily needed.

The device 1700 includes a thick film paste application component (applicator) 1702 configured to apply a paste to a dielectric layer, the paste comprising a conductive material (e.g., electrically conductive material) suspended within a polymer. The device 1700 also includes a direct imaging device 1704 (e.g., apparatus, system) configured to input a predetermined direct imaging pattern and to direct a light beam (which is part of the direct imaging device 1704) onto the paste to selectively harden portions of the paste to correspond to the predetermined direct imaging pattern of interconnects. The direct imaging device 1704 may be, for example, an ultraviolet (UV) laser system or a UV light emitting diode (LED) system. The device 1700 additionally includes a wash component or system 1706 configured to remove other portions of the paste that are not hardened to yield a patterned conductive layer in the shape of the predetermined direct imaging pattern. The device 1700 further includes a sintering oven 1708 configured to fire the substrate and the patterned conductive layer to sinter the material suspended within the polymer of the patterned conductive layer to form a sintered patterned conductive layer on the substrate in the shape of the predetermined direct imaging pattern of interconnects. The sintering oven be used on both green sheet pastes and green sheet dielectrics. In some examples, the overall fabrication device 1700 may include a mask aligner 1710 and a UV vapor lamp-based system 1712 for aligning a mask over paste and then illuminating the paste with UV light from the vapor lamp. A screen-print system 1714 may also be provided. Suitable mask aligners and screen-printing systems are provided.

Exemplary Thick Film Patterning/Polymerization Systems

Figures 18, 19:
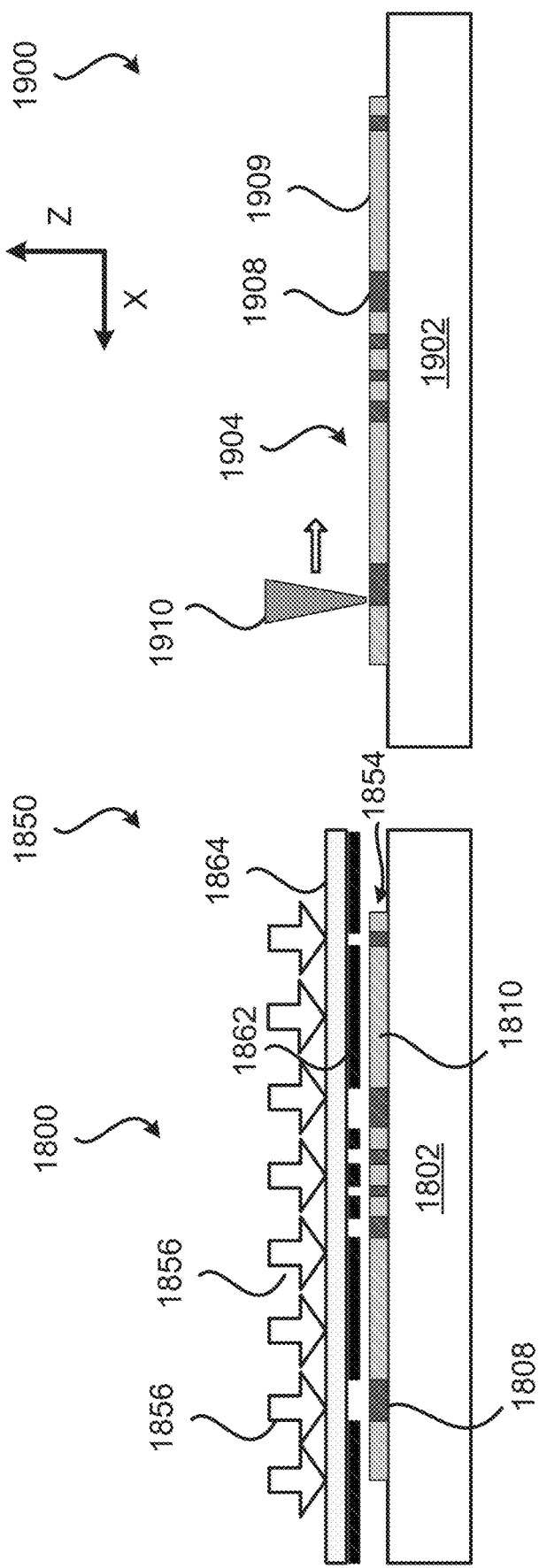
FIG. 18 illustrates components of a thick film fabrication system that may be used to fabricate packages with substrates with substantially rectangular side cross-sections.
FIG. 19 illustrates components of a thick film fabrication system that may be used to fabricate packages with substrates with substantially rectangular side cross-sections.

FIG. 18 illustrates a device 1800 for a mask-based UV polymerization of interconnects. The device 1800 may be used for fabricating a patterned conductive layer of interconnects where the interconnects have substantially rectangular side cross-sections. With the device 1800, a paste 1854 is applied over a dielectric layer 1802 (such as a low temperature co-fired ceramic (LTCC) green sheet). UV light 1856 produced by a vapor lamp (not shown in FIG. 18) is passed through a patterned mask 1862 (held in place by a mask aligner 1864) to illuminate portions of the paste 1854 (which include an electrically conductive material and a polymer) that correspond to openings in the mask pattern. Arrows in the figure illustrate that the UV light simultaneously illuminates all portions of the paste that are not blocked by the mask 1862. For negative tone photo polymers, when the UV light 1856 is turned on, the UV light hardens the polymer of all portions of the paste 1854 (that are not blocked by the mask) via polymerization so that, later, the unhardened portions of the paste may be washed away, leaving only the hardened paste in the shape of the mask pattern. In FIG. 18, darker portions 1808 of the paste represent the hardened paste, whereas lighter portions 1810 of the paste represent the unhardened portion that may be washed away. The hardened portions are the aforementioned interconnects of the substrate. It is noted that photo resists with positive tone photo polymers exist as well, with the above-described behavior reversed.

FIG. 19 illustrates a device 1900 for performing thick film patterning and polymerization using direct imaging, such as laser direct imaging (LDI). The device 1900 may be used for fabricating a patterned conductive layer of interconnects where the interconnects have substantially rectangular side cross-sections. In some implementations, the systems of FIG. 19 may be used to fabricate at least a portion of the substrate of FIG. 3. However, the systems of FIG. 19 may be used to fabricate layers for other substrates. Note that FIG. 19 is intended to illustrate only particular systems and components and is not intended to illustrate all of the components used to fabricate the packages illustrated herein.

With the device 1900, a paste 1904 is applied to a dielectric layer 1902 (such as an LTCC green sheet). For RF applications, the paste 1904 may include an electrically conductive material suspended in a polymer. The polymer may include a negative tone photo polymer or a positive tone photo polymer. In some applications, non-electrically conductive materials may be used. A UV light 1910 generated by a direct imaging system (not shown in FIG. 19) is moved over the paste 1904 and selectively turned on and off to selectively and precisely illuminate portions of the paste 1904 that correspond to a pre-programmed digital direct imaging pattern. An arrow illustrates the movement of the UV light beam over the paste.

In the case that a negative tone photo polymer, when the UV light 1910 is turned on, the UV light hardens the polymer of the portion of the paste 1904 that is illuminated via polymerization so that, later, the unhardened portions of the paste may be washed away, leaving only the hardened paste in the precise shape of the direct imaging interconnect pattern. In FIG. 19, darker portions 1908 of the paste represent the hardened paste, whereas lighter portions 1909 of the paste represent the unhardened portion that may be washed away. The hardened portions are the aforementioned interconnects of the substrate. By using direct imaging with a suitable paste, precise interconnects can be formed what have substantially rectangular side cross-sections, as already described. When a positive tone photo polymer is used, portions of the paste 1904 that is exposed by UV light is the portion that is removed, and the portions that is not exposed by the UV light is not removed.

As already noted, in some examples, prior to directing the UV light onto the paste using a precise interconnect pattern via devices 1800 or 1900, a screen-printing process may be used to form a "rough cut" pattern of the paste. That is paste is applied to a dielectric using a mask with a less precise interconnect pattern than the pattern used with UV light. In this manner, a rough mask may be used in an initial stage to create a rough paste pattern. Direct imaging or a mask aligner is then used with a more precise pattern to "fine tune" the interconnect pattern via polymerization, before the excess paste is washed away.

As mentioned above, the hardening of the paste (e.g., hardening of the polymer) may define interconnects with rectangular cross-sectional shapes. The hardening the paste to define interconnects improves the structural stability of the paste, which makes the paste hold its shape better, so that when the paste is eventually sintered and/or fired (with the dielectric layers), the resulting interconnects from the paste has rectangular cross-sectional shapes (or cross-sectional shapes with smaller corner radii) because the paste has maintained its rectangular cross-sectional shape when the sintering and/or firing begins.

Exemplary Sequence for Fabricating a Substrate with Rectangular Interconnects

Figure 20A:
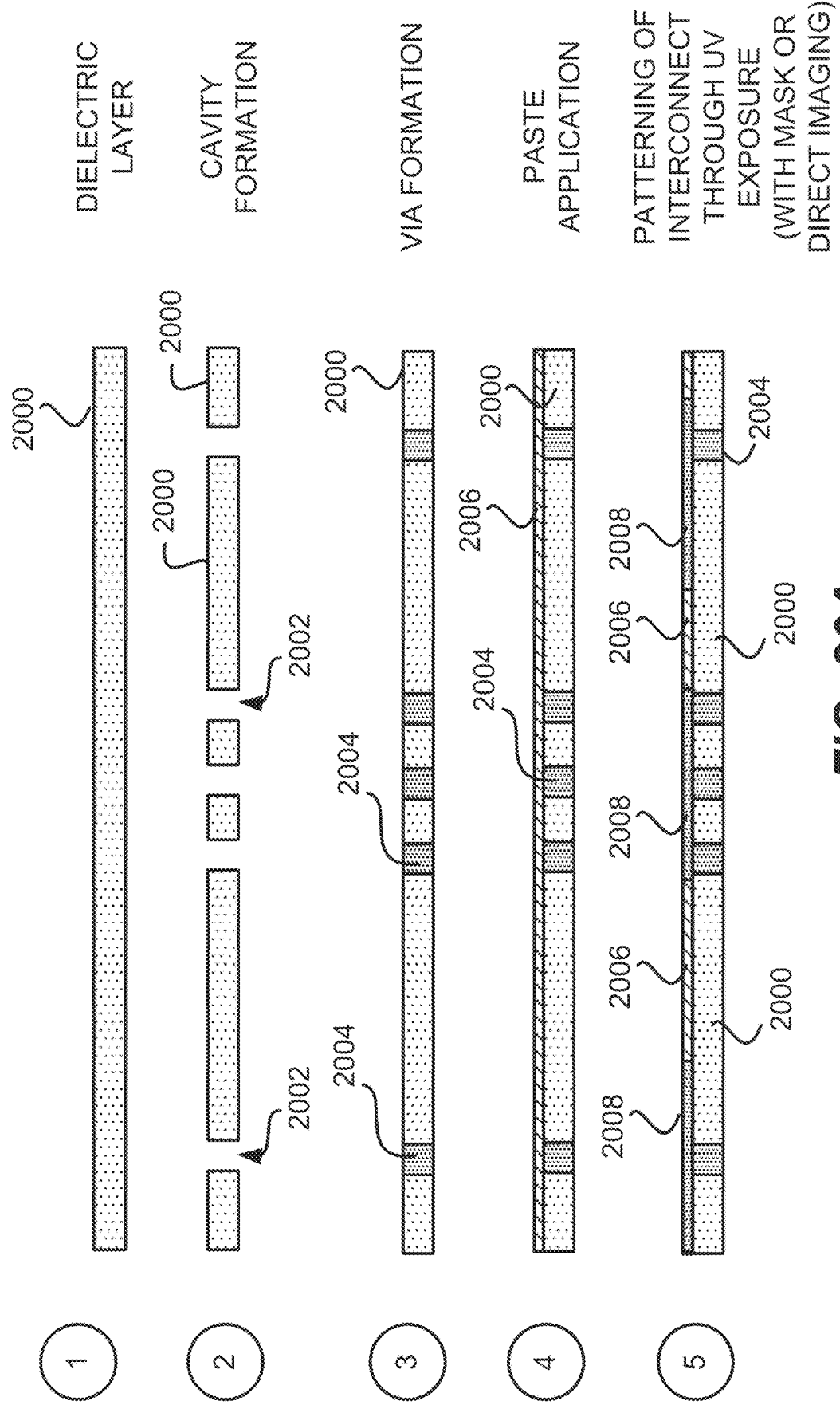
FIGS. 20A-20B illustrate an exemplary sequence for fabricating a substrate having interconnects with rectangular shaped side cross-sections.
Figure 20B:
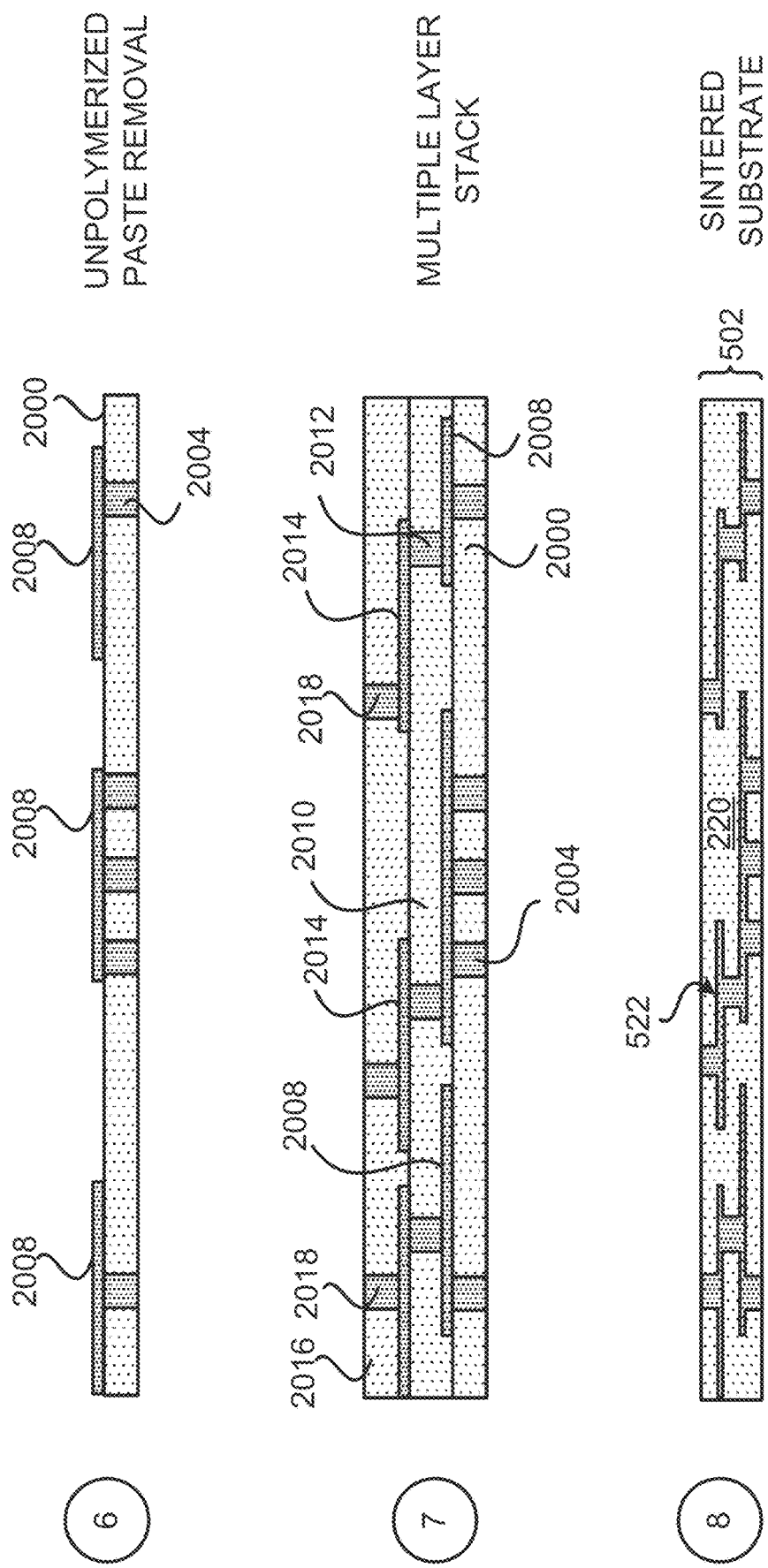

FIGS. 20A-20B illustrate an exemplary sequence for providing or fabricating a substrate that includes interconnects with substantially rectangular side cross-sections. In some implementations, the sequence of FIGS. 20A-20B may be used to provide or fabricate the substrate 302 of FIG. 3, or other substrates described in the disclosure.

The sequence of FIGS. 20A-20B may combine one or more stages in order to simplify and/or clarify the sequence for providing or fabricating the substrate. In some implementations, the order of the processes may be changed or modified. In some implementations, one or more of processes may be replaced or substituted without departing from the scope of the disclosure. As will be further described below, a tape casting process may be used to form the substrate.

Stage 1, as shown in FIG. 20A, illustrates a dielectric layer 2000, which may be a green sheet formed of LTCC or the other compounds noted below. Although not shown, the dielectric layer may be positioned on a fabrication platform or carrier platform. The dielectric layer may be, for example, a square with dimensions 8 inches by 8 inches cut from a roll of green sheet material. The square green sheet section may be referred to as a "blank."

Stage 2 illustrates a state after cavities or through-holes 2002 are formed through the dielectric layer 2000. A needle punching process may be used to form the through-holes through the dielectric layer 2000 using, for example, a high speed punching machine.

Stage 3 illustrates a state after vertical interconnects 2004 (e.g., vias) are formed in the through-holes 2002 of the dielectric layer 2000. Different implementations may form the interconnects 2004 differently. In some implementations, a screen-print process may be used to form the interconnects 2004 in the through-holes 2002. In some implementations, a silver (Ag) paste is used to fill the through-holes 2002 to form the vertical interconnects 2004. For example, a screen-printing squeegee may be used to press paste into the through-holes 2002 to fill the through-holes 2002. The paste may include electrically conductive material.

Stage 4 illustrates a state after a thick film paste 2006 is applied to the top surface of the dielectric layer to cover both the dielectric layer 2000 itself and the tops of the vias 2004. In some implementations, the same silver (Ag) paste used to fill the through-holes 2002 to form the vertical interconnects 2004 is also applied as the thick film paste 2006.

Stage 5 illustrates a state after portions 2008 of the thick film paste 2006 have been selectively polymerized using UV light to harden the portions 2008. For example, the direct imaging system of FIGS. 18-19 may be used to selectively direct a UV light beam (e.g. a laser beam) onto portions of thick film paste 2006 in accordance with an direct imaging digital pattern to polymerize (and thereby harden) those portions of the paste 2006 that match the digital pattern. This operation serves to form a hardened patterned interconnect layer within the paste 2006 in the shape of the digital pattern for a particular layer of a substrate being formed. In another example, the mask aligner/UV vapor lamp system of FIGS. 18-19 may be used to direct a UV light from a vapor lamp through a physical mask onto portions of thick film paste 2006 in accordance with masking pattern to polymerize (and thereby harden) those portions of the paste 2006 that match the pattern. This serves to form a hardened patterned interconnect layer within the paste 2006 in the shape of the physical mask pattern for the particular layer of a substrate being formed. It is noted that the direct imaging system may allow desired patterns to be more easily formed than when using a mask aligner/UV vapor lamp system due to the flexibility of direct imaging (e.g. direct writing) and the advantage that no mask is used (where a mask is hardcoded and leads to a copying of the pattern). Direct imaging is also contactless.

Stage 6, as shown in FIG. 20B, illustrates a state after unpolymerized portions of the paste 2006 are removed leaving only the polymerized (hardened) portions 2008. For example, a suitable wash may be applied to the paste 2006 to wash away the portions that were not hardened.

Upon completion of Stage 6, one interconnect pattern layer of a substrate to be formed has been completed. Often, substrates include multiple layers and hence the process of Stages 1-6 may be repeated to form the additional layers. In some examples, each individual layer is laminated and then set aside upon completion and then the various layers are stacked one upon the other to form a stack. When stacking the layers, care is taken to align the vertical vias of one layer with the horizontal interconnects of an adjacent layer to form a three-dimensional interconnect pattern. In other examples, each new layer may be formed atop a previous layer so that the layers are progressively stacked.

Stage 7 illustrates a state after multiple layers are stacked. In this example, a second layer includes additional dielectric 2010 (which may be part of a second "green sheet" dielectric layer), additional vias 2012, and additional horizontal interconnects 2014. The second layer is formed or positioned atop the first layer (that includes dielectric layer 2000, which again may be LTCC, vias 2004, which again may be formed of silver paste, and horizontal interconnects formed from hardened paste portion 2008. The interconnects 2014 of the second layer may be formed using the same UV polymerization process used to form the interconnects (from paste portion 2008) of the first layer. For example, either the direct imaging-based polymerization procedure or the mask aligner/vapor lamp procedure may be used to selectively harden portions of a thick film silver paste to form a second layer of a three-dimensional interconnect pattern. In the example of FIG. 20B, a third top layer includes a dielectric layer 2016, which again may be LTCC and vias 2018, which again may be formed of silver paste. In this example, the top layer of the stack does not include horizontal interconnects since the vias 2018 are meant to be coupled to solder interconnects (not shown in FIG. 20B) of a solder resist layer (such as layer 224 of FIG. 3).

Stage 8 illustrates a state after the sintering of the multi-layer stack of Stage 7 to form a substrate 302 that includes the plurality of interconnects 322. Sintering may be performed by placing the stack of Stage 7 in a suitable oven to fire the stack at 850 C.° (or other suitable temperature). Sintering may cause the polymer and organic materials to burn off. In some implementations, sintering may reduce the thickness of the dielectric layers and/or the interconnects. The sintering process also may be referred to as a curing process (e.g., firing process, binder burn-out process). Sintering causes silver crystals or grains in the silver paste within the vias and within the various horizontal interconnects of the stack to sinter and merge (or coalesce) together to form one or more three-dimensional conductive structures that interconnect a bottom surface of the substrate to a top surface of the substrate. Sintering can cause shrinkage of the substrate, namely shrinkage of the plurality of interconnects 322. In the example shown at Stage 8, sintering results in a z-direction shrinkage of the substrate 302, thus reducing the thickness of the substrate 302 and the plurality of interconnects 322. In some implementations, the thickness of the substrate 302 (from the green state shown in Stage 7) is reduced in a range of about 40%-50% when a constrained sintering process is used. In a constrained sintering process, the dimensions of the substrate 302 in the x-direction and the y-direction may stay relatively the same. However, different implementations may produce substrates with different shrinkages. For example, in some implementations, a free sintering process may be used that reduces the dimensions of the substrate 302 in all directions (e.g., z-direction, y-direction, x-direction). In such instances, the size of the substrate 302 and the plurality of interconnects 322 may be reduced in a range of about 15%-20% in all direction. In some implementations, to account for the sintering and reduction in the dimensions of the substrate 302 and the plurality of interconnects 322, the size of the plurality of interconnects defined by the exposure during the green state is adjusted accordingly. For example, to produce a substrate that includes an interconnect with a height to width aspect ratio of 1:2 (e.g., 10 micrometers height, 20 micrometers width), the interconnect may be define as having a height of about 20 micrometers and a width of about 20 micrometers (if we use constrained sintering). After a constrained sintering process, the interconnect may have a thickness of about 10 micrometers and a width of about 20 micrometers.

In the particular example of FIGS. 20A-20B, the substrate 302 includes a plurality of interconnects 322. Depending upon the application, these interconnects may form capacitors, wave-guides, or portions thereof, or other electrical components, such as components adapted for mm Wave applications. Note that the interconnect structures of Stage 8 of FIG. 20B have rectangular side cross-sections with sharp corners, as discussed above. It is noted that different implementations may use different paste with different materials. Thus, the materials described in the disclosure for the paste is merely exemplary.

Exemplary Flow Diagram of a Method for Fabricating a Substrate

Figure 21:
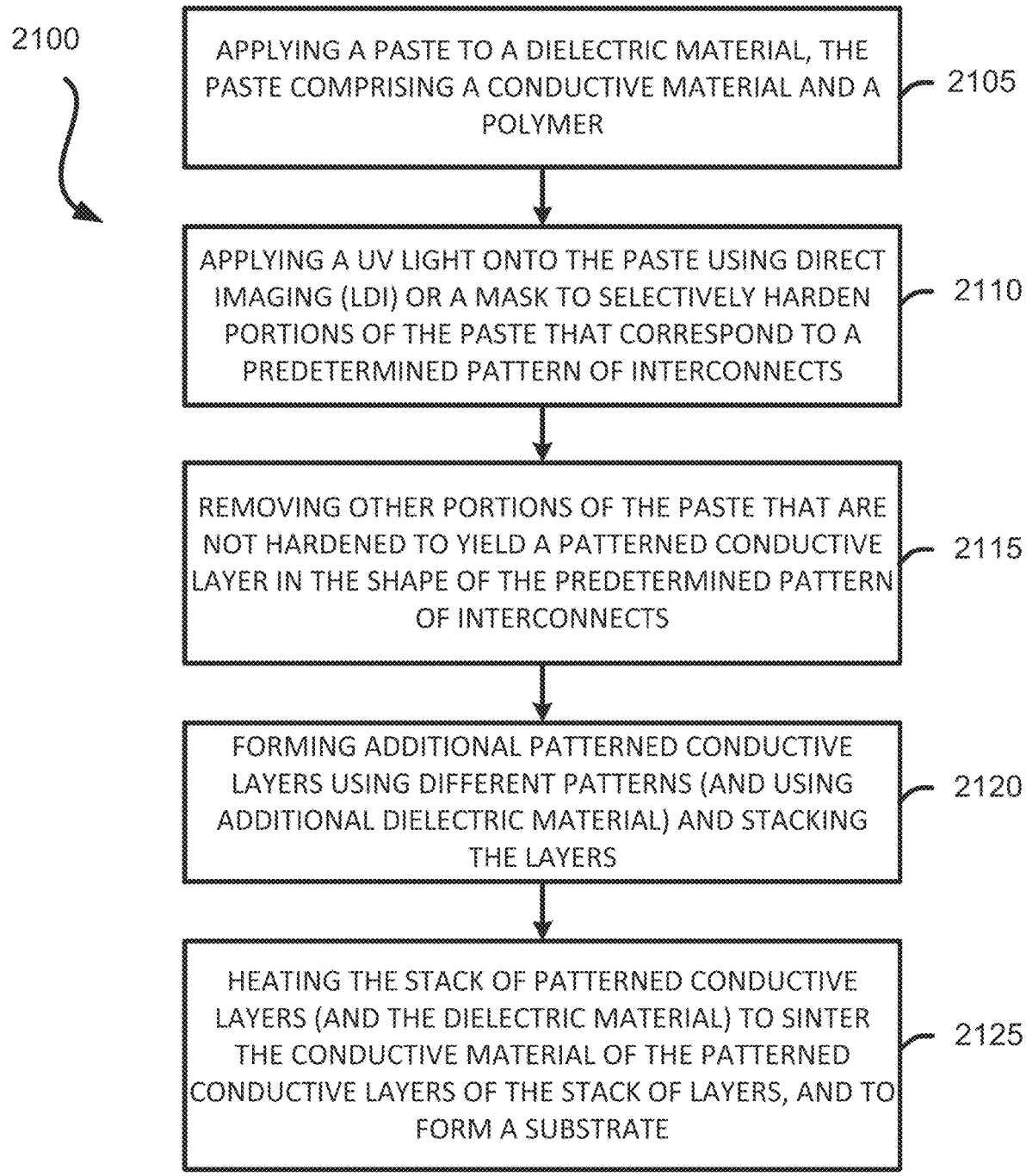
FIG. 21 illustrates an exemplary flow diagram of a method for fabricating a substrate having interconnects with rectangular shaped side cross-sections.

FIG. 21 illustrates an exemplary flow diagram of a method 2100 for providing or fabricating a substrate having interconnects with substantially rectangular side cross-sections or for fabricating other substrates. As discussed above, the use of a light to harden the polymer helps fabricate interconnects with substantially rectangular side cross-sections. In some implementations, the method 2100 of FIG. 21 may be used to provide or fabricate at least a portion of the substrate of FIG. 3 described in the disclosure. However, the method 2100 may be used to provide or fabricate any of the substrates described in the disclosure that have interconnects with substantially rectangular side cross-sections.

It should be noted that the sequence of FIG. 21 may combine one or more processes in order to simplify and/or clarify the method for providing or fabricating a substrate. In some implementations, the order of the processes may be changed or modified.

The method includes (at 2105) applying a paste to a dielectric material on a fabrication platform, the paste comprising a conductive material (e.g., electrically conductive material) and a negative tone or positive tone photo polymer (where, for example, the conductive material may include grains of conductors suspended within the polymer). The dielectric material may be an LTCC green sheet.

The method includes (at 2110) directing UV light onto the paste using either direct imaging (e.g. LDI) or a physical mask (aligned over the paste using a mask aligner) to selectively harden portions of the paste that correspond to a predetermined pattern of interconnects. The UV light may be in the range of 320-415 nm (e.g. UV-A), in particular may be at 375 nm of 405 nm.

The pattern, for example, may represent one layer of a multi-layer substrate (e.g. the substrate of FIG. 3). Hardening at 2110 may be achieved by causing a polymer portion of the paste to harden due to the UV light via the process of polymerization. The frequency and intensity of the UV light may be chosen to achieve a satisfactory degree of polymerization, which may depend on the particular paste. When using direct imaging, the predetermined pattern may be a digital direct imaging pattern (specified, for example, as a Gerber pattern) which is used to control the direct imaging system to polymerize portions of the paste that match the direct imaging pattern. When using a physical mask, the pattern (also specified, for example, as a Gerber pattern) may be cut into the mask to permit UV light from a UV vapor lamp to polymerize portions of the paste that match the mask pattern.

The hardening of the paste may define interconnects with rectangular cross-sectional shapes. The hardening the paste (e.g., hardening of the polymer) to define interconnects improves the structural stability of the paste which makes the paste hold its shape better, so that when the paste is eventually sintered and/or fired (with the dielectric layers), the resulting interconnects from the paste has rectangular cross-sectional shapes (or cross-sectional shapes with smaller corner radii) because the paste has maintained its rectangular cross-sectional shape when the sintering and/or firing begins. Without the hardening of the paste, prior to the sintering and/or firing of the paste, some portion of the side wall of the unhardened paste will settle to its side and thus lose some of its rectangular shape and/or predefined shape. Therefore, when the sintering and/or firing of the unhardened paste begins, the paste that define the interconnect has already lost its rectangular shape.

The method includes (at 2115) removing other portions of the paste that are not hardened to yield a patterned conductive layer in the shape of the predetermined pattern of interconnects. This may include washing away the non-hardened portions of the paste (which may then be used in the fabrication of another substrate).

The method includes (at 2120) forming additional patterned conductive layers using different patterns (and using additional dielectric material) and stacking the layers. For example, the operations of 2105, 2110, and 2115 may be repeated with different patterns to form a set of conducting pattern layers (each formed on an LTCC green sheet) where, collectively, the set of layers may form a three-dimensional interconnection pattern of conductors (interconnects). The three-dimensional interconnection pattern of conductors may form, for example, electrical components such as capacitors or waveguides or the like. The set of layers are stacked one atop the other to form a stack for firing in an oven.

The method includes (at 2125) heating the stack of patterned conductive layers (and the dielectric material) to sinter the conductive material (e.g., electrically conductive material) of the paste of the patterned conductive layer of interconnects. In some examples, the material is fired at 850 C°. During this process, the dielectric portion of the stack of layers may sinter and form together to fill in the spaces between the interconnects (e.g. the grains grow and form together to fill in any pores) so that the interconnects are embedded in dielectric material, such as LTCC. Note that, in other examples, sintering is not performed. That is, for some devices or some applications, the stack of layers of polymerized paste (forming the pattern of interconnects) is used in a final package or product. Note also that the technologies described herein can also be applied on already fired substrates, e.g. $Al_2O_3$. In some implementations, a sintering may not be necessary. The sintering and/or firing of the sheet of metal paste and dielectric paste may cause the polymer and organic materials to burn off.

Note also that in some examples, prior to directing the UV light onto the paste (1854) using a precise interconnect pattern, a screen-printing process may be used to form a "rough cut" pattern of the paste. That is paste is applied to a dielectric using a mask with a less precise interconnect pattern than the pattern used with UV light. In this manner, a rough mask may be used in an initial stage to create a rough paste pattern. Direct imaging or a mask aligner is then used with a more precise pattern to "fine tune" the interconnect pattern via polymerization, before the excess paste is washed away.

Exemplary Flow Diagram of a Method for Fabricating a Substrate

Figure 22:
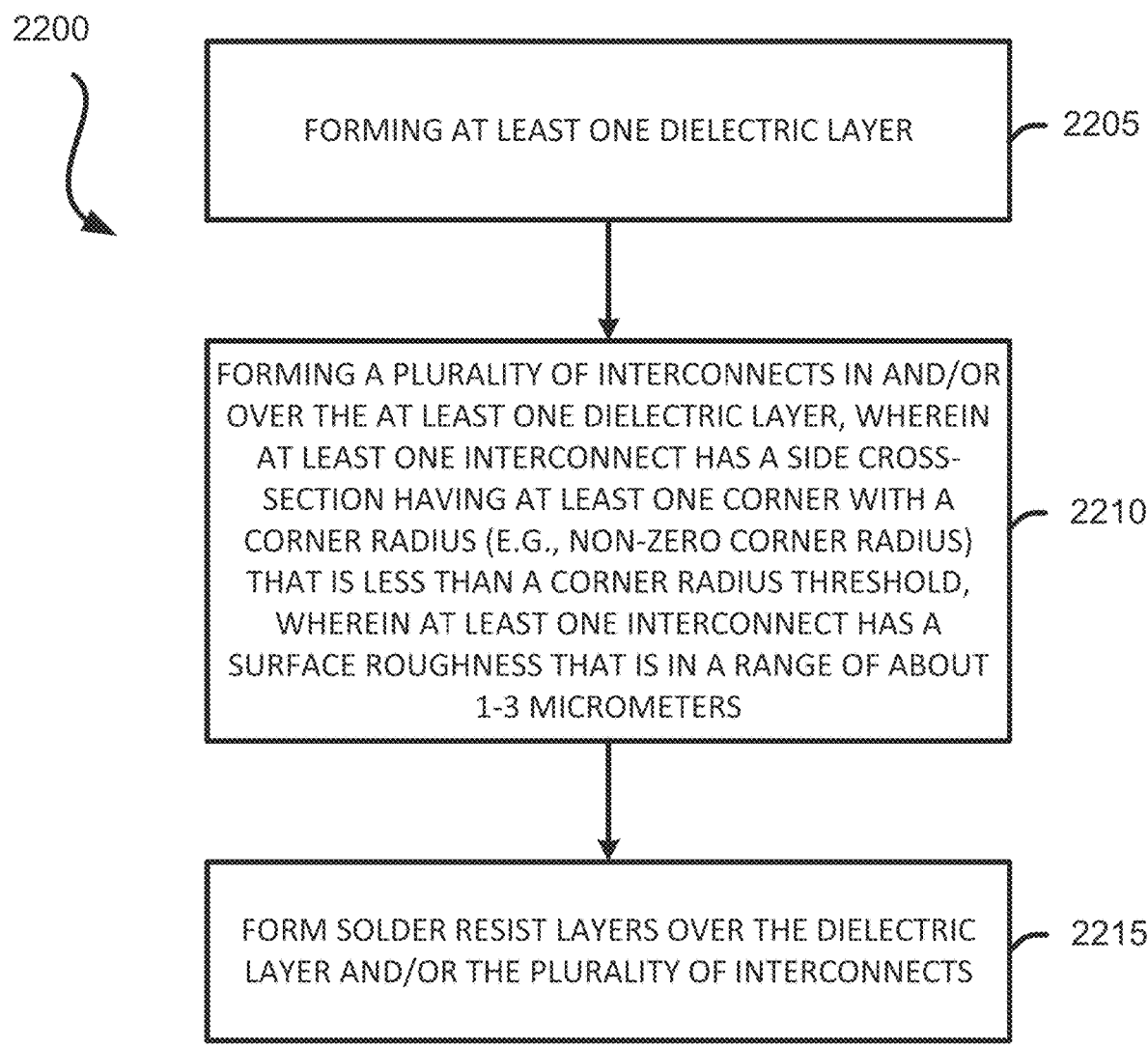
FIG. 22 illustrates an exemplary flow diagram of a method for fabricating a substrate having interconnects with rectangular shaped side cross-sections.

FIG. 22 illustrates an exemplary flow diagram of a method 2200 for providing or fabricating a substrate having interconnects with substantially rectangular side cross-sections or for fabricating other substrates. In some implementations, the method 2200 of FIG. 22 may be used to provide or fabricate at least a portion of the substrate of FIG. 3 described in the disclosure. However, the method 2200 may be used to provide or fabricate other substrates described in the disclosure that have interconnects with substantially rectangular side cross-sections.

It should be noted that the sequence of FIG. 22 may combine one or more processes in order to simplify and/or clarify the method for providing or fabricating a substrate. In some implementations, the order of the processes may be changed or modified.

The method forms (at 2205) one or more dielectric layers (e.g., 220). In some examples, the at least one dielectric layer is formed to comprise a low temperature co-fired ceramic (LTCC), high temperature co-fired ceramic (HTCC), aluminum nitride (AlN), zinc oxide (ZnO), zirconium oxide ($ZrO_2$), and/or combinations thereof.

The method forms (at 2210) a plurality of interconnects (e.g., 322) in and over the dielectric layers (e.g., 220). In some examples, the at least one interconnect is formed to comprise silver (Ag), gold (Au), molybdenum (Mo), tungsten (W), platinum (Pt), palladium (Pd), ruthenium sesquioxide ($Ru_2O_3$), and/or combinations thereof. The plurality of interconnects may have a surface roughness that is in a range of approximately 1-3 micrometers. The plurality of interconnects may have a rectangular side cross-section shape and/or shapes with small corner radii. As mentioned above, the hardening of the paste that is used to form the interconnects helps form interconnects with rectangular side cross-sections. FIG. 21 illustrates and describes a process for forming a plurality of interconnects with rectangular side cross-section shapes and/or shapes with small corner radii.

In some examples, forming the plurality of interconnects may include using the thick film process described below. However, different implementations may use different processes for forming the dielectric layer and the plurality of interconnects.

The method forms (at 2215) solder resist layer(s) (e.g., 224, 226) over the at least one dielectric layer (e.g., 220) and/or the interconnects (e.g., 322). A first solder resist layer may be formed over a first surface of a substrate, and a second solder resist layer may be formed over a second surface of the substrate. For example, a first solder resist layer 224 may be formed over the top of at least one dielectric layer 220, and a second solder resist layer 226 may be formed over the bottom of the dielectric layer 220.

Exemplary Sequence for Fabricating a Package That Includes a Substrate

Figure 23A:
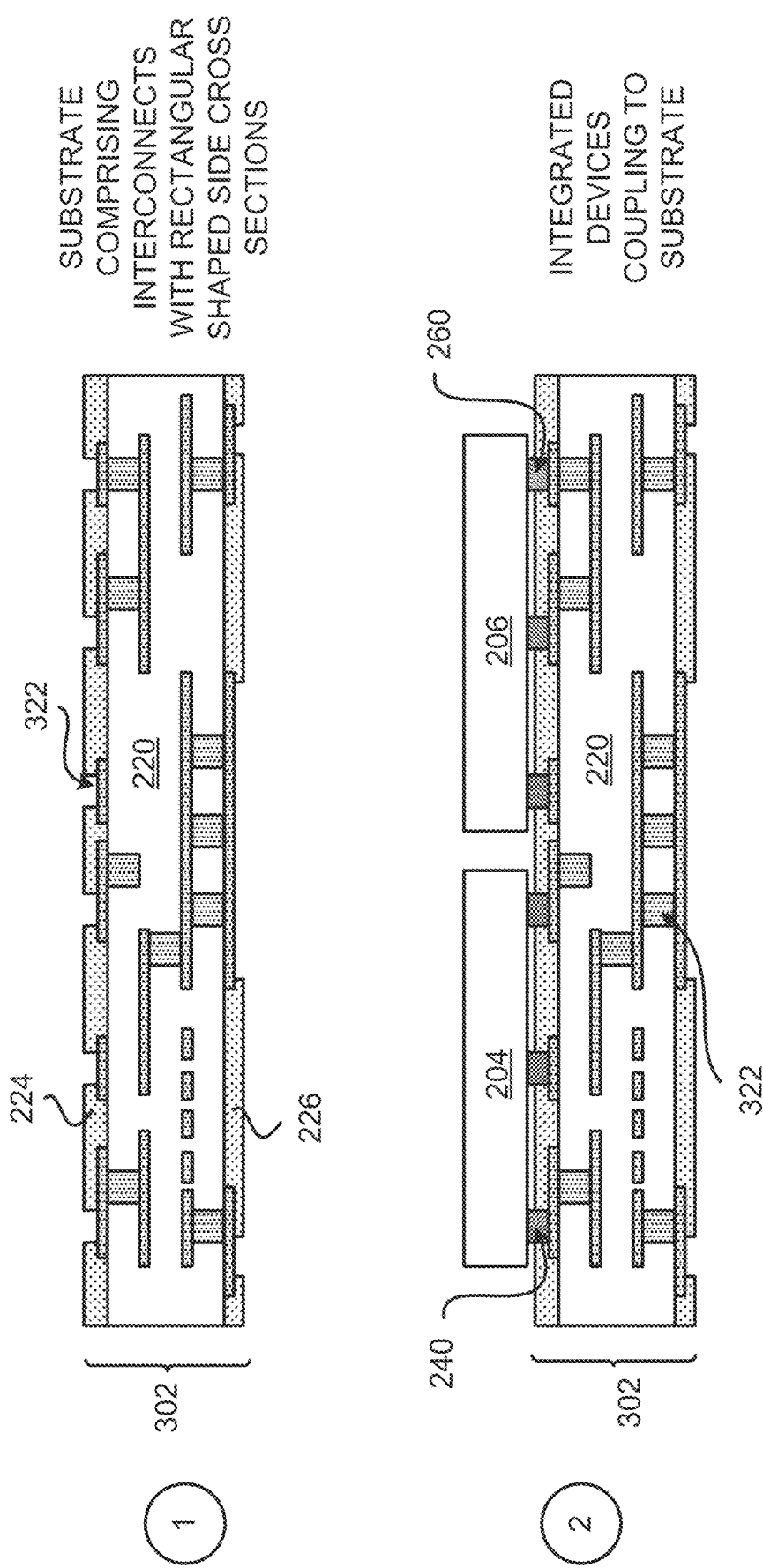
FIGS. 23A-23B illustrate an exemplary sequence for fabricating a package comprising a substrate having interconnects with rectangular shaped side cross-sections.
Figure 23B:
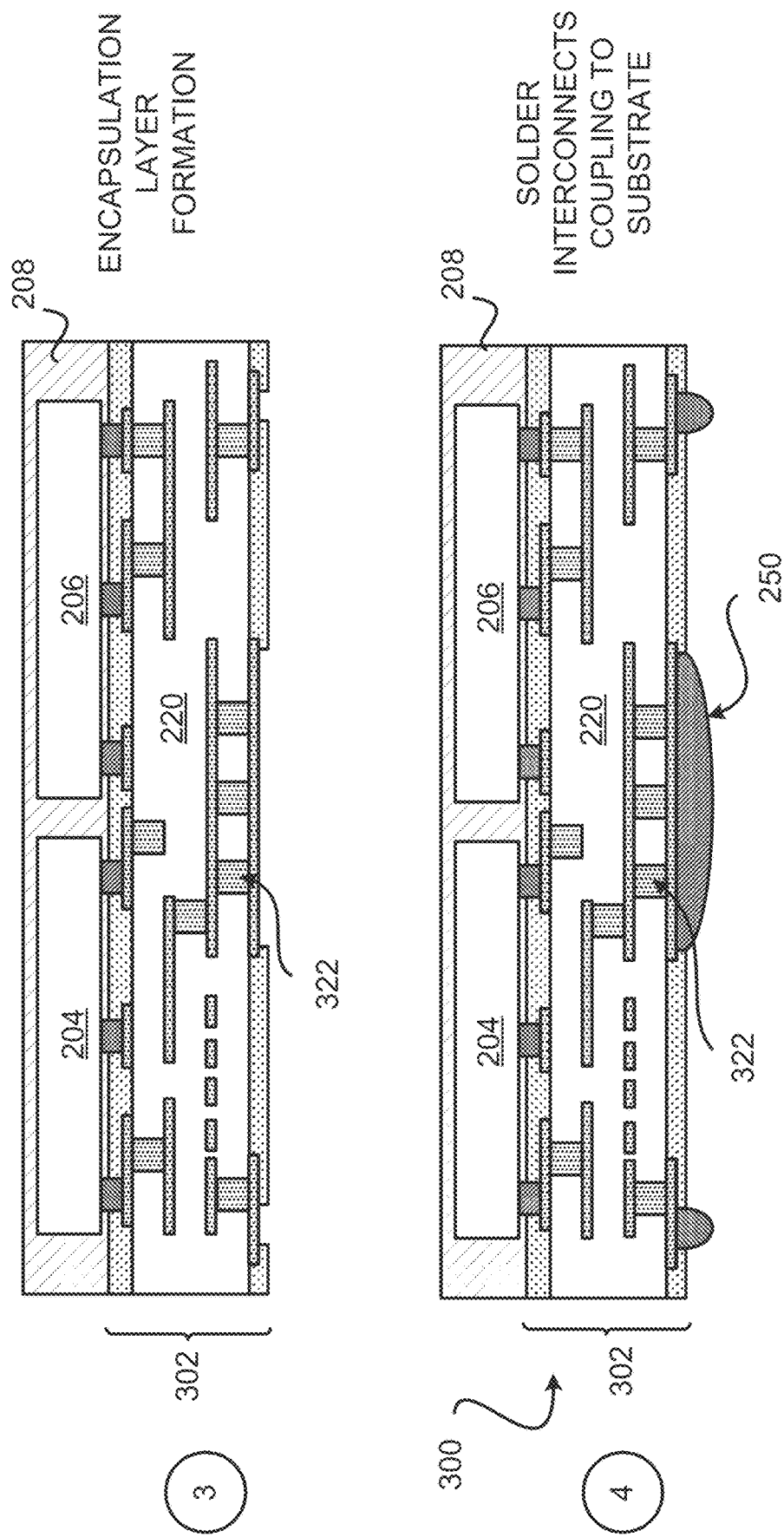

FIGS. 23A-23B illustrate an exemplary sequence for providing or fabricating package comprising a substrate. In some implementations, the sequence of FIGS. 23A-23B may be used to provide or fabricate the package 300 of FIG. 3, or any of the packages described in the disclosure.

It should be noted that the sequence of FIGS. 23A-23B may combine one or more stages in order to simplify and/or clarify the sequence for providing or fabricating the package comprising a substrate. In some implementations, the order of the processes may be changed or modified. In some implementations, one or more of processes may be replaced or substituted without departing from the scope of the disclosure.

Stage 1, as shown in FIG. 23A, illustrates a state after a substrate 302 is provided. The substrate 302 includes at least one dielectric layer 220, a plurality of interconnects 322, a solder resist layer 224, and a solder resist layer 226. FIGS. 20A-20B illustrate an example of fabricating the substrate 302.

Stage 2 illustrates a state after an integrated device 204 is coupled to the substrate 302 through a plurality of solder interconnects 240. The integrated device 204 is coupled to a first surface of the substrate 302. Stage 2 also illustrates an integrated device 206 coupled to the substrate 302 through a plurality of solder interconnects 260. The integrated device 206 is coupled to a first surface of the substrate 302. A reflow process may be used to couple the integrated device 204 and the integrated device 206 to the substrate 302. The plurality of solder interconnects 240 and the plurality of solder interconnects 260 are coupled to the plurality of interconnects 322 of the substrate 302.

Stage 3, as shown in FIG. 23B, illustrates a state after an encapsulation layer 208 is formed over the substrate 302. The encapsulation layer 208 is formed over the first surface of the substrate 302 (e.g., over the solder resist layer 224 of the substrate 302) such that the encapsulation layer 208 encapsulates the integrated device 204 and/or the integrated device 206. Different implementations may provide the encapsulation layer 208 differently. For example, a compression and transfer molding process, a sheet molding process, or a liquid molding process may be used to provide and form the encapsulation layer 208.

Stage 4 illustrates a state after a plurality of solder interconnects 250 are coupled to the substrate 302. In particular, Stage 4 illustrates a state after the plurality of solder interconnects 250 is coupled to the plurality of interconnects 322. Stage 4 may illustrate an example of the package 300 of FIG. 3. In some implementations, the package 300 is part of a wafer, and singulation may be performed to cut the wafer into individual packages.

Figure 24:
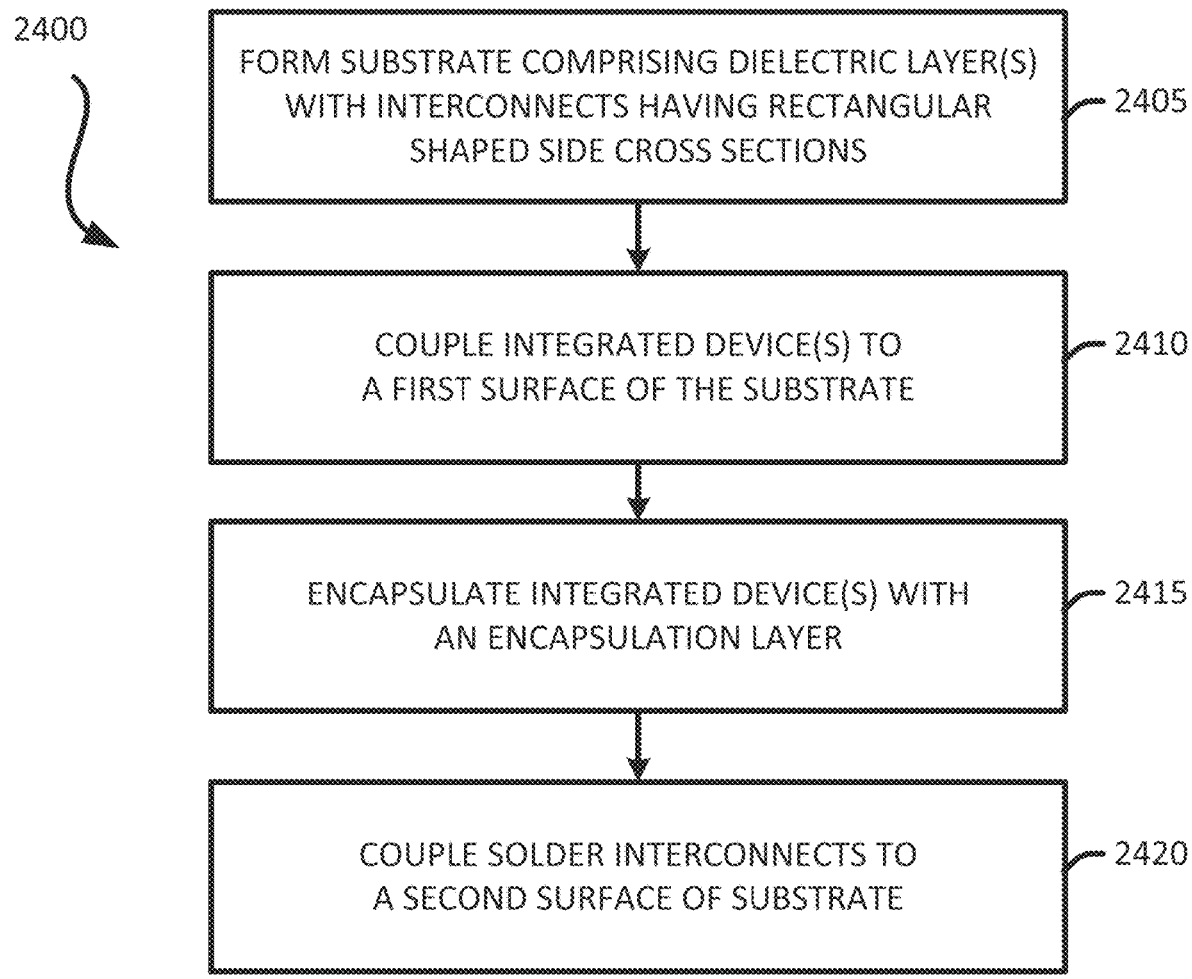
FIG. 24 illustrates an exemplary flow diagram of a method for fabricating a package comprising a substrate having interconnects with rectangular shaped side cross-sections.

Exemplary Flow Diagram of a Method for Fabricating a Package that Includes a Substrate In some implementations, fabricating a package comprising a substrate includes several processes. FIG. 24 illustrates an exemplary flow diagram of a method 2400 for providing or fabricating a package comprising a substrate. In some implementations, the method 2400 of FIG. 24 may be used to provide or fabricate the package 300 of FIG. 3 described in the disclosure. However, the method 2400 may be used to provide or fabricate any of the packages described in the disclosure.

It should be noted that the sequence of FIG. 24 may combine one or more processes in order to simplify and/or clarify the method for providing or fabricating a package comprising a substrate. In some implementations, the order of the processes may be changed or modified.

The method provides (at 2405) a substrate (e.g., 302) that includes dielectric layers with interconnects have a substantially rectangular side cross section. For example, the substrate that is provided may include at least one dielectric layer 220, a plurality of interconnects 322, a solder resist layer 224, and a solder resist layer 226.

The method couples (at 2410) one or more integrated devices to the substrate (e.g., first surface of the substrate). For example, an integrated device 204 may be coupled to the substrate 302 through a plurality of solder interconnects 240. An integrated device 206 may be coupled to the substrate 302 through a plurality of solder interconnects 260. A reflow process may be used to couple the integrated device 204 and the integrated device 206 to the substrate 302. The plurality of solder interconnects 240 and the plurality of solder interconnects 260 are coupled to the plurality of interconnects 322 of the substrate 302.

The method encapsulates (at 2415) the integrated device (e.g., 204, 206) with an encapsulation layer (e.g., 208). The encapsulation layer 208 may be formed over the substrate 302. For example, the encapsulation layer 208 may be formed over the first surface of the substrate 302 (e.g., over the solder resist layer 224 of the substrate 302) such that the encapsulation layer 208 encapsulates the integrated device 204 and/or the integrated device 206. Different implementations may provide the encapsulation layer 208 differently. For example, a compression and transfer molding process, a sheet molding process, or a liquid molding process may be used to provide and form the encapsulation layer 208.

The method couples (at 2420) the plurality of solder interconnects (e.g., 250) to a second surface of the substrate (e.g., 302). For example, the plurality of solder interconnects 250 is coupled to the plurality of interconnects 322 of the substrate 302. In some implementations, the package is part of a wafer, and the method may perform singulation to cut the wafer into individual packages. The package (e.g., 300) may then be coupled to a board (e.g., 290) through the plurality of solder interconnects 250.

Further Information

Thick film technology often exploits screen-print processes to form substrates with interconnects. However, as noted, issues can arise in RF performance due to losses in the metal traces (e.g. skin-effect losses). Moreover, screen-print offers limited resolution (in terms of line/width) and limited X-Y accuracy (particularly over 8-inch-sized components). Herein, techniques are described for thick film fabrication that utilize masks or direct imaging. In some examples, particular thick film conducting pastes are used in combination with LTCC, which may include green-sheet (e.g. not fired) LTCC as well as with fired substrates (LTCC, High Temperature Co-Fired Ceramic (HTCC), Glass, ZnO, ZrO2). In some examples, the thick film paste may be sintered or fired after structuring (though sintering is often optional) to remove the polymer.

The processes and materials described herein may provide for precise rectangular cross-sections of the metal structure and higher resolution components. Precision may be achieved in terms of (a) line width to line space, (b) line thickness, (c) clearance, i.e. line to large areal, and (d) cut-outs in large areas. In this regard, it is often desirable to achieve aspect ratios where (a) line width to line space is as small as possible: e.g. 20 μm line/space and where (b) line width to line thickness is as close as possible to 1:1, and with a target of, e.g. 10 μm thickness and 20 μm line width. In terms of line edges and shape factors, it is desirable to achieve a "rectangular" (90° angle). Insofar as cutouts are concerned, it is desirable to provide cutouts as small as possible with a target 100 μm (for a line to adjacent a large area).

Using the techniques and materials described herein, many of these goals can be achieved, which provide for form stability, particularly for an Ag structure. Substantially rectangular cross-sections can be achieved, along with lateral form stability, and with "extreme" aspect ratios and resolutions.

The processes and materials described herein thus may provide for 1) form stability of the line/pattern after sintering; 2) lateral form stability and geometrical stability; 3) metallization in a stable form in a green state, which stays more or less stable during the subsequent processes such as stacking, lamination, and sintering, and 4) cut out stability.

Mask alignment techniques (as shown in FIG. 20) can avoid many of these issues, such as NLD. Line width resolution can achieve 30/30 (and, in some cases 25/25). Small openings in large areas are achievable. Small lines adjacent to large area prints are also achievable. The process is independent of feature size and geometry.

Direct imaging techniques (as also shown in FIG. 20) can also avoid many of the issues of screen-printing. For example, line width resolution can also achieve 30/30 (and, in some cases 25/25). Small openings in large areas are achievable. Small lines adjacent to large area prints are also achievable. The process is independent of feature size and geometry. Additionally, patterning on the fly is feasible, which allows, e.g., for stamping, coding, counting, data matrix coding (DMC), and traceability. With direct imaging, no photo plots, masks, or screens are needed. Digital data is used to define the pattern and control the UV laser.

Thus, one or more of the following can be achieved using processes and materials described herein: a) better line shape; b) reduced losses; c) higher resolution higher routing density, higher density of embedded functionality; d) applicability to green sheets (not fired) as well on fired substrates; e) precisely rectangular-shaped cross-sections; f) digital design processes; g) waste material recycled (because the developed paste is not contaminated with other materials; h) stacking of different material layers; and i) different substrate materials: LTCC, HTCC, ZnO, AlN, ZrO2, etc. (Note that LTCC has certain advantages in terms of low loss and heat dissipation.) The patterned structures may employ Ag, Cu, W, Pt, Pd, $Ru_2O_3$ Resistor Paste, Dielectric Paste ($Al_2O_3$, Glass) and combinations thereof.

Exemplary Electronic Devices

Figure 25:
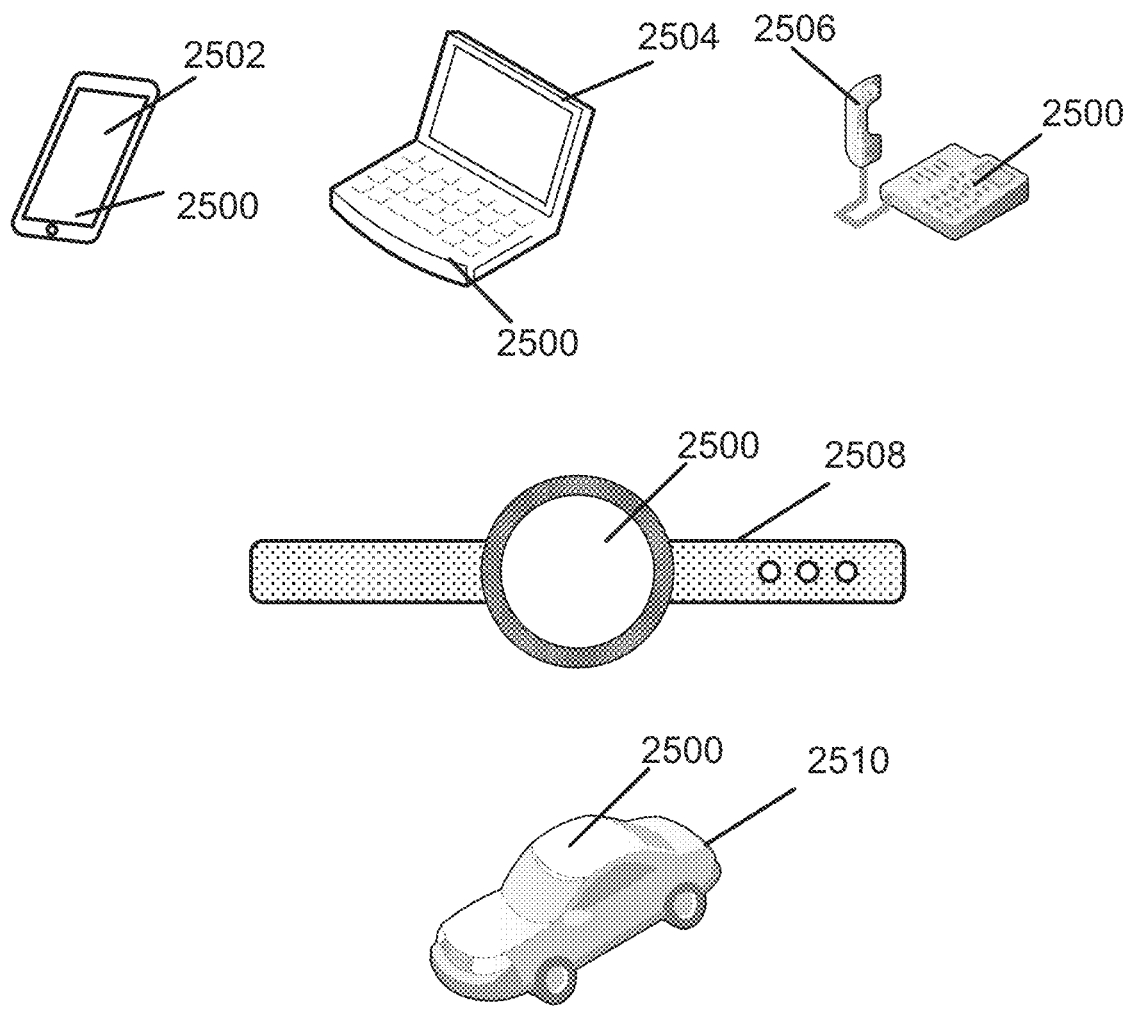
FIG. 25 illustrates various electronic devices that may integrate a die, an integrated device, an integrated passive device (IPD), a passive component, a package, and/or a device package described herein.

FIG. 25 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 2502, a laptop computer device 2504, a fixed location terminal device 2506, a wearable device 2508, or automotive vehicle 2510 may include a device 2500 as described herein. The device 2500 may be, for example, any of the devices and/or integrated circuit (IC) packages described herein. The devices 2502, 2504, 2506 and 2508 and the vehicle 2510 illustrated in FIG. 25 are merely exemplary. Other electronic devices may also feature the device 2500 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 3-25 may be rearranged and/or combined into a single component, process, feature or function or embodied in several components, processes, or functions. Additional elements, components, processes, and/or functions may also be added without departing from the disclosure. It should also be noted that the substrates, packages and processes illustrated in the figures and/or described in the present disclosure are not limited to dies and/or ICs. In some implementations, the substrates, packages and processes may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

Devices using the substrates and packages described herein may be employed in mmWave 5G applications, as well as for 3D routing, embedded filters and wave-guides.

It is noted that the figures in the disclosure may not be to scale. In some instances, for purpose of clarity, not all components and/or parts may be shown. In some instances, the position, the location, and/or the sizes, of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another—even if they do not directly physically touch each other. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The term "encapsulating" means that the object may partially encapsulate or completely encapsulate another object. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a redistribution metal layer, and/or an under bump metallization (UBM) layer. In some implementations, an interconnect is an electrically conductive material that may be configured to provide an electrical path for a signal (e.g., a data signal), ground and/or power. An interconnect may include more than one element or component. An interconnect may be defined by one or more interconnects. An interconnect may include one or more metal layers. An interconnect may be part of a circuit. Different implementations may use different processes and/or sequences for forming the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. A package comprising:
   an integrated device; and
   a substrate coupled to the integrated device, the substrate comprising:
   at least one dielectric layer; and
   a plurality of interconnects located in the at least one dielectric layer,
   wherein at least one interconnect from the plurality of interconnects has a cross-sectional thickness that varies along a length of the at least one interconnect by no more than 3 micrometers,
   wherein the at least one interconnect from the plurality of interconnects includes a thickness and a width, and
   wherein one or more of the thickness and/or the width has a value of 30 micrometers or less.

2. The package of claim 1, wherein the at least one interconnect has a surface roughness that is in a range of approximately 1-3 micrometers.

3. The package of claim 1, wherein the at least one interconnect has a side cross-section having at least one corner with a corner radius that is in a range of approximately 0.5-2 micrometers.

4. The package of claim 1, wherein a side cross-section of the at least one interconnect has an effective shape that is one or more of a rectangle, square, or oval.

5. The package of claim 1,
   wherein a first interconnect from the plurality of interconnects includes a first thickness and a first width,
   wherein a second interconnect from the plurality of interconnects includes a second thickness and a second width,
   wherein the first interconnect and the second interconnect include a pitch and a spacing,
   wherein one or more of the first thickness, the second thickness, the pitch, the spacing, the first width and/or the second width has a value of 30 micrometers or less, and
   wherein the at least one interconnect from the plurality of interconnects includes (i) a first corner having a first corner radius of 2 micrometers or less, and (ii) a second corner having a second corner radius of 2 micrometers or less.

6. The package of claim 1, wherein the at least one interconnect has a height to width aspect ratio of approximately 1:2 or less.

7. The package of claim 1, wherein the at least one dielectric layer comprises a ceramic, a low temperature co-fired ceramic (LTCC), high temperature co-fired ceramic (HTCC), aluminum nitride (AlN), zinc oxide (ZnO), zirconium oxide ($ZrO_2$), and/or combinations thereof.

8. The package of claim 1, wherein the at least one interconnect comprises silver (Ag), gold (Au), molybdenum (Mo), tungsten (W), platinum (Pt), palladium (Pd), ruthenium sesquioxide ($Ru_2O_3$), and/or combinations thereof.

9. The package of claim 1, wherein the integrated device includes a radio frequency (RF) device, an analog device, a passive device, a filter, a capacitor, an inductor, an antenna, a transmitter, a receiver, a surface acoustic wave (SAW) filter, a bulk acoustic wave (BAW) filter, a light emitting diode (LED) integrated device, a silicon (Si) based integrated device, a silicon carbide (SiC) based integrated device, a GaAs based integrated device, a GaN based integrated device, a memory, power management processor, and/or combinations thereof.

10. A substrate comprising:
    at least one dielectric layer; and
    a plurality of interconnects located in the at least one dielectric layer,
    wherein at least one interconnect from the plurality of interconnects has a surface roughness that is in a range of approximately 1-3 micrometers, and
    wherein the at least one interconnect has a height to width aspect ratio of approximately 1:2 or less.

11. The substrate of claim 10, wherein the at least one interconnect has a cross-sectional thickness that varies along a length of the interconnect by no more than 3 micrometers.

12. The substrate of claim 10, wherein the at least one interconnect has a side cross-section having at least one corner with a corner radius that is in a range of approximately 0.5-2 micrometers.

13. The substrate of claim 10, wherein a side cross-section of the at least one interconnect has an effective shape that is one or more of a rectangle, square, or oval.

14. The substrate of claim 10,
    wherein the plurality of interconnects includes a thickness, a pitch, a spacing and a width, and
    wherein one or more of the thickness, the pitch, the spacing, and/or the width has a value of 30 micrometers or less.

15. The substrate of claim 10,
    wherein the at least one interconnect from the plurality of interconnects includes (i) a first corner having a first corner radius of 2 micrometers or less, and (ii) a second corner having a second corner radius of 2 micrometers or less, and
    wherein the at least one interconnect has a thickness in a range of about 10-30 micrometers.

16. The substrate of claim 10, wherein the at least one dielectric layer comprises a ceramic, a low temperature co-fired ceramic (LTCC), high temperature co-fired ceramic (HTCC), aluminum nitride (AlN), zinc oxide (ZnO), zirconium oxide ($ZrO_2$), and/or combinations thereof.

17. A method for fabricating a substrate, the method comprising:
    forming at least one dielectric layer; and
    forming a plurality of interconnects in or over the at least one dielectric layer, wherein at least one interconnect from the plurality of interconnects has a surface roughness that is in a range of approximately 1-3 micrometers,
    wherein the at least one interconnect from the plurality of interconnects is formed to have a thickness and a width, and
    wherein one or more of the thickness and/or the width has a value of 30 micrometers or less.

18. The method of claim 17, wherein forming the plurality of interconnects comprises:

applying a paste to the at least one dielectric layer, the paste comprising an electrically conductive material and a polymer;

applying ultraviolet (UV) light onto the paste to selectively harden portions of the paste that correspond to a predetermined pattern of interconnects;

removing portions of the paste that are not hardened to yield a patterned conductive layer in a shape of the predetermined pattern of interconnects; and heating the patterned conductive layer to sinter the electrically conductive material.

19. The method of claim 18, wherein applying the UV light onto the paste comprises directing a UV light beam onto the paste using direct imaging to selectively harden portions of the paste that correspond to a digital direct imaging pattern of interconnects.

20. The method of claim 18, wherein applying the UV light onto the paste comprises directing a UV light beam from a vapor lamp through a mask onto the paste to selectively harden portions of the paste that correspond to a pattern of interconnects.

21. The method of claim 18, wherein the paste includes a thick film paste and the electrically conductive material comprises grains and/or crystals.

22. The method of claim 17, wherein the at least one dielectric layer comprises one or more of a ceramic, a low temperature co-fired ceramic (LTCC), a high temperature co-fired ceramic (HTCC), glass, zinc oxide (ZnO), zirconium oxide ($ZrO_2$), aluminum nitride (AlN), and/or combinations thereof.

23. The method of claim 17 wherein the at least one interconnect is formed to have an effective shape that is one or more of a rectangle, square, or oval.

24. The method of claim 17,
wherein the at least one interconnect from the plurality of interconnects includes (i) a first corner having a first corner radius of 2 micrometers or less, and (ii) a second corner having a second corner radius of 2 micrometers or less, and
wherein the at least one interconnect has a thickness in a range of about 10-30 micrometers.

25. The method of claim 17, wherein the at least one interconnect is formed with a height to width aspect ratio between approximately 1:2 and 1:1.

26. The method of claim 17, wherein the at least one interconnect from the plurality of interconnects, has a side cross-section having at least one corner with a corner radius that is in a range of approximately 0.5-2 micrometers.

* * * * *